US012684863B2

(12) United States Patent
Williams et al.

(10) Patent No.: US 12,684,863 B2
(45) Date of Patent: Jul. 14, 2026

(54) FOLDED SERIES SWITCHES

(71) Applicant: QUALCOMM Incorporated, San Diego, CA (US)

(72) Inventors: Thomas Hua-Min Williams, Irvine, CA (US); Conor Roche, Cork (IE); Khaja Ahmad Shaik, San Diego, CA (US); Hanil Lee, San Diego, CA (US); Roger Lee Mills, Pflugerville, TX (US); Benjamin Griffitts, Santa Ana, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 803 days.

(21) Appl. No.: 17/939,392

(22) Filed: Sep. 7, 2022

(65) Prior Publication Data

US 2024/0079407 A1 Mar. 7, 2024

(51) Int. Cl.
H10D 84/83 (2025.01)
H10D 64/27 (2025.01)
H10W 20/43 (2026.01)

(52) U.S. Cl.
CPC ......... H10D 84/834 (2025.01); H10D 64/519 (2025.01); H10W 20/43 (2026.01)

(58) Field of Classification Search
CPC . H10D 84/83–859; H10D 64/517–519; H10D 89/10; H10D 84/85; H10D 84/0193; H01L 23/5226; H01L 23/528
See application file for complete search history.

(56) References Cited

U.S. PATENT DOCUMENTS

| | | |
|---|---|---|
| 6,333,656 B1 | 12/2001 | Schober |
| 8,709,880 B2 | 4/2014 | Or-Bach et al. |
| 9,990,022 B2 | 6/2018 | Wong et al. |
| 10,573,643 B2 | 2/2020 | Do et al. |
| 11,328,957 B2 | 5/2022 | Peng et al. |
| 2010/0033259 A1* | 2/2010 | Miyashita ............ H03B 5/1225 331/117 FE |
| 2014/0001563 A1* | 1/2014 | Rashed ................ H10D 84/907 257/E27.06 |
| 2015/0179566 A1* | 6/2015 | Hill ...................... H10D 64/281 257/77 |
| 2018/0004276 A1* | 1/2018 | Wong ........................ H02J 1/08 |
| 2019/0237542 A1 | 8/2019 | Chen et al. |
| 2021/0203323 A1 | 7/2021 | Hsu et al. |
| 2021/0391318 A1 | 12/2021 | Peng et al. |

(Continued)

FOREIGN PATENT DOCUMENTS

| DE | 102020115154 A1 | 12/2020 |

OTHER PUBLICATIONS

"Fin field-effect transistor"; Wikipedia; https://en.wikipedia.org/w/index.php?title=Fin_field-effect_transistor&oldid=884089995 (Year: 2019).*

(Continued)

*Primary Examiner* — Britt Hanley
*Assistant Examiner* — Jason James Greaving
(74) *Attorney, Agent, or Firm* — Loza & Loza, LLP

(57) ABSTRACT

A chip includes a first active region, first gates extending over the first active region in a first direction, wherein the first gates correspond to a first transistor, and second gates extending over the first active region in the first direction, wherein the second gates correspond to a second transistor.

19 Claims, 18 Drawing Sheets

(56)                    References Cited

U.S. PATENT DOCUMENTS

2022/0181325 A1\*    6/2022  Chintarlapalli Reddy  ..................
                                             H10D 89/10
2022/0208757 A1\*    6/2022  Do  ........................ H01L 23/535

OTHER PUBLICATIONS

Partial International Search Report—PCT/US2023/069816—ISA/
EPO—Sep. 28, 2023.
International Search Report and Written Opinion—PCT/US2023/
069816—ISA/EPO—Dec. 8, 2023.

\* cited by examiner

100

160

130-2

110

M3
V2
M2
V1
M1
V0
M0
VD
MD
Source/Drain
120-2

M3
V2
M2
V1
M1
V0
M0
VG
MP
Gate
135
115

M3
V2
M2
V1
M1
V0
M0
VD
MD
Source/Drain
130-1
120-1

150

Substrate

FOLDED SERIES SWITCHES

BACKGROUND

Field

Aspects of the present disclosure relate generally to chip layout, and, more particularly, to layout of transistors on a chip.

Background

A large number of transistors may be integrated on a chip (i.e., die). To integrate the transistors on the chip, a chip layout is generated specifying the geometries and placements of transistors on the chip. The chip layout may also specify metal routing on the chip. The metal routing may interconnect transistors, couple transistors to a supply rail and/or ground, and the like.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

An aspect relates to a chip. The chip includes a first active region, first gates extending over the first active region in a first direction, wherein the first gates correspond to a first transistor, and second gates extending over the first active region in the first direction, wherein the second gates correspond to a second transistor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
FIG. 1 shows a side view of an example of a chip including metal layers and vias according to certain aspects of the present disclosure.

FIG. 1 shows a side view of an example of a chip 100 (i.e., die) according to certain aspects. The chip 100 may include many devices (e.g., transistors) integrated on the chip 100. In this regard, FIG. 1 shows an example of a transistor 110 integrated on the chip 100. Although one transistor 110 is shown in FIG. 1 for simplicity, it is to be appreciated that the chip 100 may include many transistors.

In the example shown in FIG. 1, the transistor 110 includes a gate 115, a first source/drain 120-1, and a second source/drain 120-2. As used herein, the term "source/drain" means source, drain, or both. The gate 115 is formed over a channel between the first source/drain 120-1 and the second source/drain 120-2. The transistor 110 may also include a thin gate oxide (not shown) between the gate and the channel. The gate 115 may be a poly-silicon gate, a metal gate, or another type of gate. In the example shown in FIG. 1, the transistor 110 is depicted as a planar transistor. However, it is to be appreciated that the transistor 110 may be implemented with a fin field-effect transistor (FinFET), an example of which is discussed below with reference to FIGS. 2A and 2B.

The chip 100 may also includes a first source/drain contact 130-1 formed on the first source/drain 120-1, and a second source/drain contact 130-2 formed on the second source/drain 120-2. The source/drain contacts 130-1 and 130-2 may be formed from a source/drain contact layer (labeled "MD" in FIG. 1) using, for example, a lithographic process and an etching process. Although the source/drain contact layer is labeled "MD" in the example in FIG. 1, it is to be appreciated that the source/drain contact layer may also be labeled "CA" or another label.

The chip 100 may also include a gate contact 135 formed on the gate 115. The gate contact 135 may be formed from a gate contact layer (labeled "MP" in FIG. 1) using, for example, a lithographic process and an etching process. Although the gate contact layer is labeled "MP" in the example in FIG. 1, it is to be appreciated that the gate contact layer may also be labeled with another label.

The chip 100 may also include a stack of metal layers 150. The metal layers 150 are patterned (e.g., using lithography and etching) to provide metal routing for the transistor 110 and other transistors on the chip 100. The metal routing may be used, for example, to interconnect transistors on the chip 100, couple transistors to a supply rail and/or ground, and the like. The metal layers 150 may also be referred to as metallization layers, or another term.

In the example in FIG. 1, the bottom-most metal layer may be designated metal layer M0 (also referred to as metal 0), the metal layer immediately above metal layer M0 may be designated metal layer M1 (also referred to as metal 1), the metal layer immediately above metal layer M1 may be designated metal layer M2 (also referred to as metal 2), the metal layer immediately above metal layer M2 may be designated metal layer M3 (also referred to as metal 3), and so forth. Although four metal layers are shown in FIG. 1 for ease of illustration, it is to be appreciated that the chip 100 may include additional metal layers (e.g., five or more metal layers including metal layer M4, metal layer M5, and so forth). It is to be appreciated that the present disclosure is not limited to the nomenclature in which the bottom-most metal layer is designated metal layer M0. For instance, in another example, the bottom-most metal layer may be designated metal layer M1 instead of metal layer M0.

The chip 100 also includes vias 160 that provide electrical coupling between the metal layers 150, and between metal layer M0 and the contacts 130-1, 130-2, and 135. In this example, the vias VD provide electrical coupling between the source/drain contacts 130-1 and 130-2 and metal layer M0, and the via VG provides electrical coupling between the gate contact 135 and metal layer M0. The vias V0 provide electrical coupling between metal layer M0 and metal layer M1, the vias V1 provide electrical coupling between metal layer M1 and metal layer M2, and the vias V2 provide electrical coupling between metal layer M2 and metal layer M3.

Figure 2A:
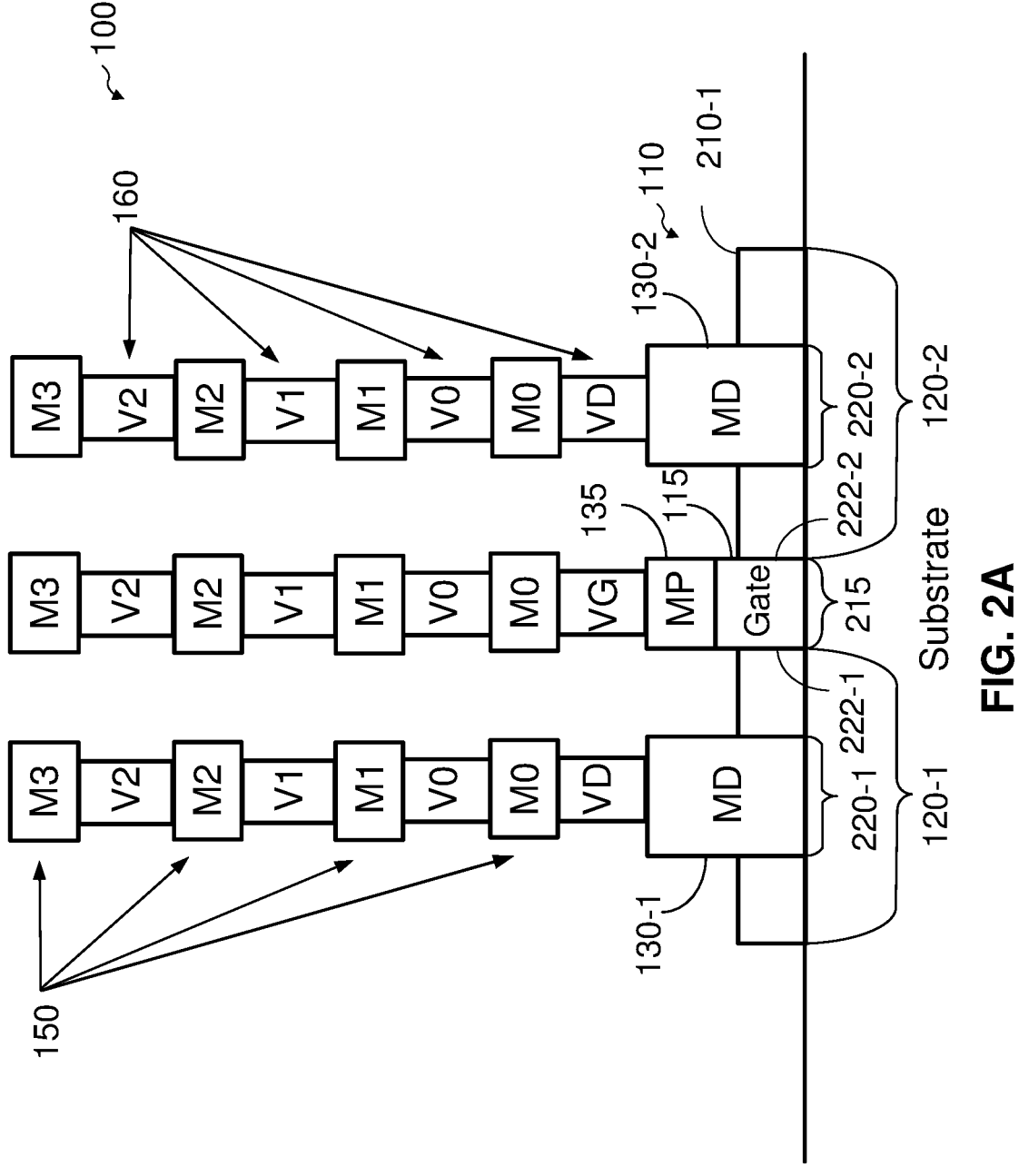
FIG. 2A shows a side view of an example of a fin field-effect transistor (FinFET) according to certain aspects of the present disclosure.
Figure 2B:
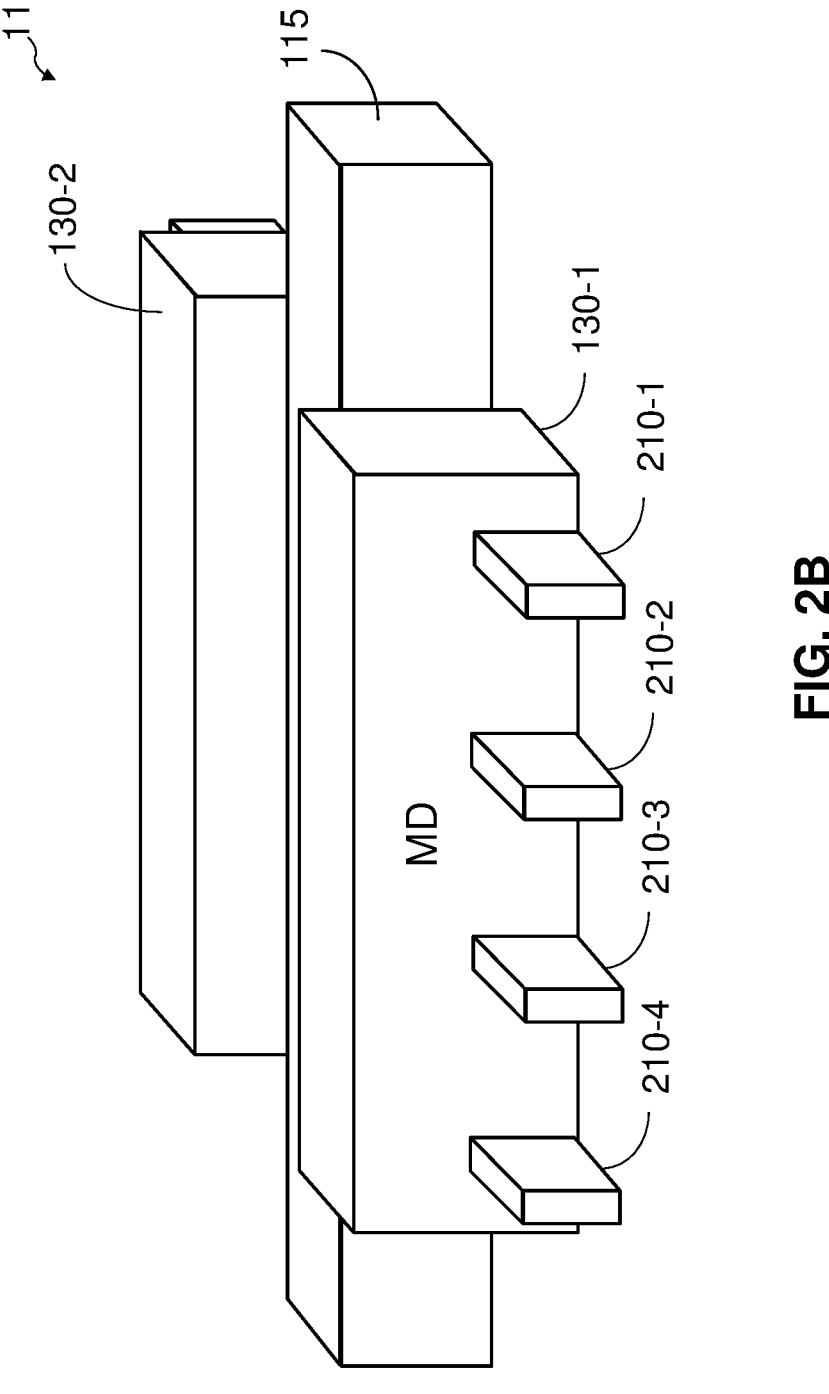
FIG. 2B shows a perspective view of the FinFET according to certain aspects of the present disclosure.

FIG. 2A shows a side view and FIG. 2B shows a perspective view of an example in which the transistor 110 is implemented with a FinFET. In this example, the transistor 110 includes fins 210-1 to 210-4 that extend perpendicularly with respect to the gate 115 and the source/drain contacts 130-1 and 130-2 (shown in FIG. 2B). Although four fins 210-1 to 210-4 are shown in the example in FIG. 2B, it is to be understood that the transistor 110 may include a different number of fins. Also, although the fins 210-1 to 210-4 are shown as having rectangular cross sections, it is to be understood that the fins may having other cross-sectional shapes (e.g., tapered cross sections). Note that the metal layers 150, the vias 160, and the gate contact 135 are not explicitly shown in FIG. 2B.

In this example, the gate 115 is formed over a first portion 215 of the fins 210-1 to 210-4. The gate 115 may wrap around three or more sides of each fin (e.g., the top side and two opposite sidewalls of each fin). In this example, the transistor 110 may also include a thin dielectric layer (not shown) interposed between the fins 210-1 to 210-4 and the gate 115. As shown in FIG. 2A, the gate contact 135 may be formed on the gate 115, and the via VG may electrically couple the gate contact 135 to metal layer M0.

A portion of the fins 210-1 to 210-4 extending from a first side 222-1 of the gate 115 forms the first source/drain 120-1, and a portion of the fins 210-1 to 210-4 extending from a second side 222-2 of the gate 115 forms the second source/drain 120-2, in which the first side 222-1 and the second side 222-2 are opposite sides of the gate 115. In this example, the first source/drain contact 130-1 is formed over a second portion 220-1 of the fins 210-1 to 210-4 on the first side 222-1 of the gate 115, and the second source/drain contact 130-2 is formed over a third portion 220-2 of the fins 210-1 to 210-4 on the second side 222-2 of the gate 115. Each of the source/drain contacts 130-1 to 130-2 may be made of a conductive material (e.g., one or more metals). As shown in FIG. 2A, the vias VD may electrically couple the source/drain contacts 130-1 to 130-2 to metal layer M0.

Figure 3A:
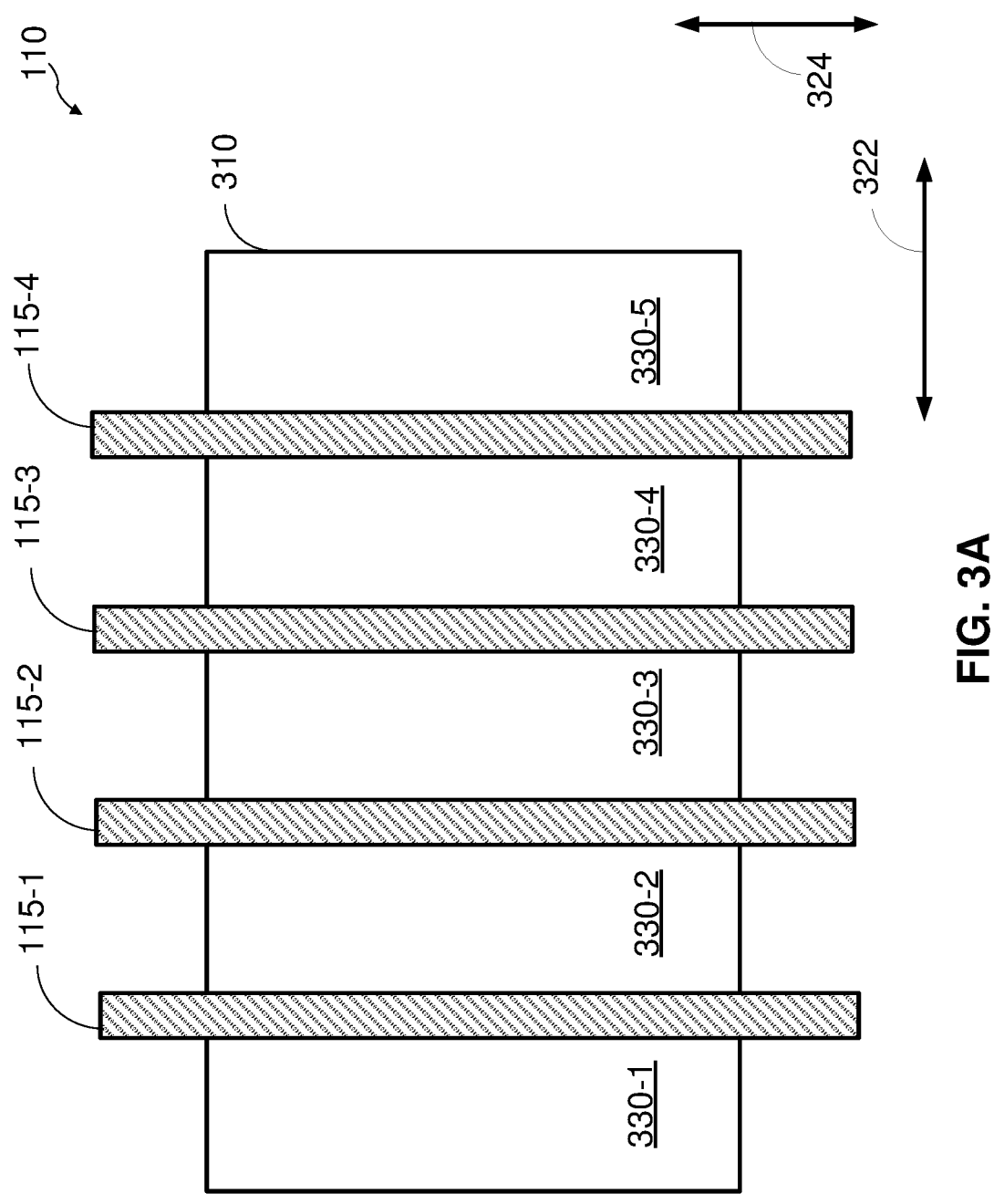
FIG. 3A shows a top view of an example of a multi-gate transistor according to certain aspects of the present disclosure.

In certain aspects, the transistor 110 may be a multi-gate transistor including multiple gates (also referred to as fingers). As used herein, a "multi-gate" transistor is a transistor including two or more gates. FIG. 3A shows an example in which the transistor 110 is implemented with a multi-gate transistor. In this example, the transistor 110 includes an active region 310 and multiple gates 115-1 to 1154. The sources/drains and channels of the transistor 110 are formed in the active region 310. For a FinFET process, the active region 310 includes fins (e.g., not shown in FIG. 3A). The active region 310 may also be referred to as an active diffusion, an active area, an oxide diffusion (OD), or another term.

The gates 115-1 to 115-4 run parallel to one another, and are spaced apart from one another in lateral direction 322. As used herein, a "lateral" direction is a direction that is parallel to the substrate of the chip 100 (i.e., die). In the example in FIG. 3A, each of the gates 115-1 to 1154 is elongated and extends over the active region 310 in lateral direction 324, where lateral direction 324 is perpendicular to lateral direction 322. The portions of the active region 310 under the gates 115-1 to 115-4 provide channels of the transistor 110. Each of the gates 115-1 to 115-4 may be a poly-silicon gate, a metal gate, or another type of gate. It is to be appreciated that the transistor 110 is not limited to the number of gates shown in FIG. 3A, and that the transistor 110 may have a different number of gates.

In the example in FIG. 3A, the active region 310 includes a first source/drain 330-1, a second source/drain 330-2, a third source/drain 330-3, a fourth source/drain 330-4, a fifth source/drain 330-5, in which the sources/drains 330-1 to 330-5 are separated from one another by the gates 115-1 to 115-4. Although not explicitly shown in FIG. 3A, it is to be appreciated that a source/drain contact may be placed on each source/drain. For a FinFET process, the active region 310 includes fins (not shown in FIG. 3A), where each fin is elongated and extends in lateral direction 322.

Figure 3B:
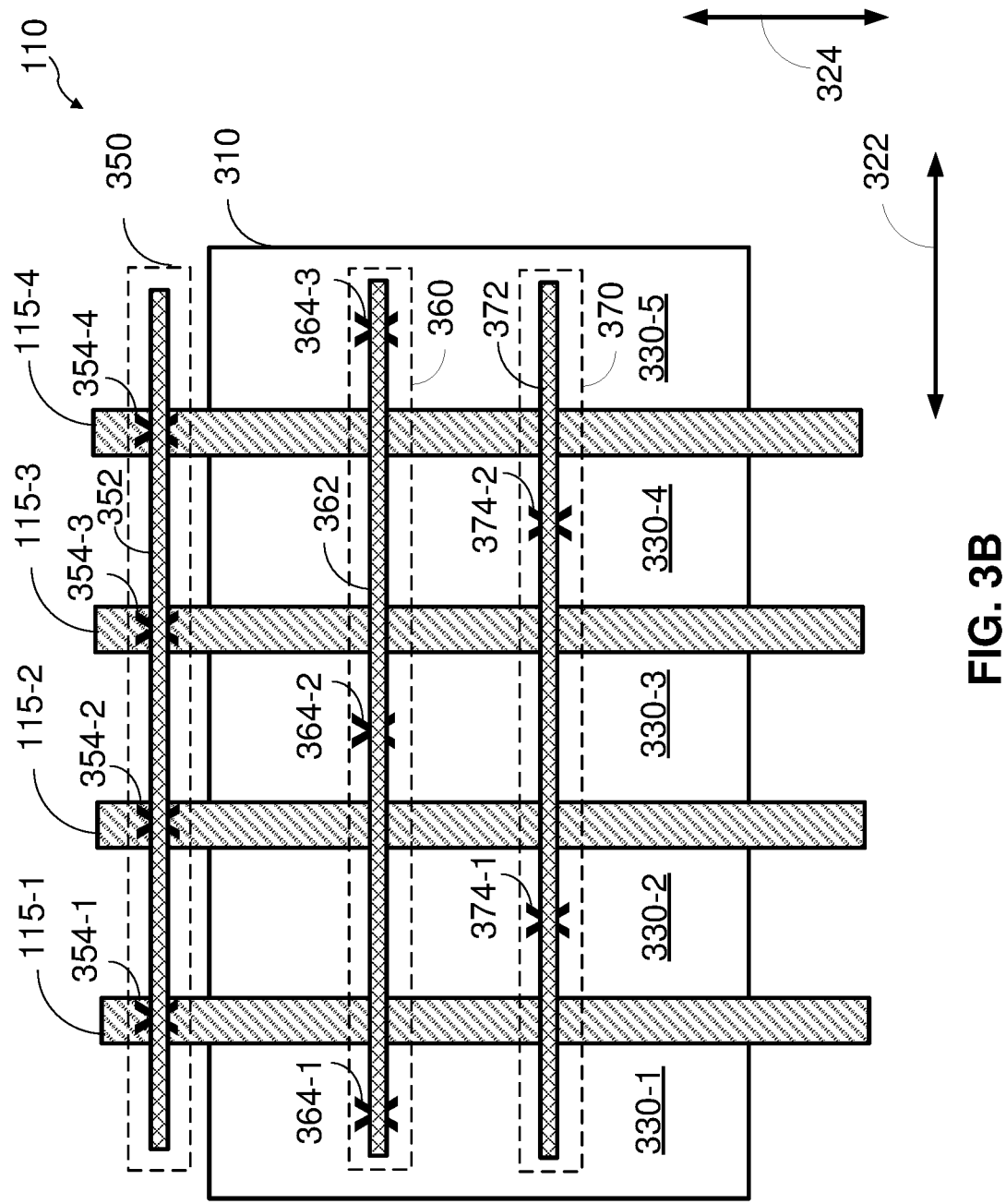
FIG. 3B shows an example of interconnects for the multi-gate transistor according to certain aspects of the present disclosure.

FIG. 3B shows an example of a first interconnect 350 electrically coupling the gates 115-1 to 1154 to one another. As used herein, an "interconnect" may be a structure that electrically couples two or more elements. An interconnect may include one or more contacts, one or more vias, and/or one or more metal lines formed from one or more of the metal layers 150. In this example, the first interconnect 350 may provide a gate terminal for the transistor 110.

In the example shown in FIG. 3B, the first interconnect 350 includes a metal line 352 and conducting paths 354-1 to 354-4. In this example, metal line 352 extends across the gates 115-1 to 115-4 in lateral direction 322. The metal line 352 may be formed from one of the metal layers 150 (e.g., using a lithographic process and an etching process). It is to be appreciated that the width of the metal line 352 may be larger than shown in FIG. 3B.

Each of the conducting paths 354-1 to 354-4 may couple a respective one of the gates 115-1 to 1154 to the metal line 352. Each of the conducting paths 354-1 to 354-4 may include a gate contact, one or more vias (e.g., via VG), and/or one or more portions formed from one or more of the metal layers 150. In FIG. 3B, each of the conducting paths 354-1 to 354-4 is represented by an X. It is to be appreciated that the first interconnect 350 is not limited to the example shown in FIG. 3B. It is also to be appreciated that the first interconnect 350 is not limited to the exemplary location shown in FIG. 3B, and that the first interconnect 350 may be placed at various locations on the chip 100 (i.e., die).

FIG. 3B also shows an example of a second interconnect 360 electrically coupling the first source/drain 330-1, the third source/drain 330-3, and the fifth source/drain 330-5 to one another. In this example, the second interconnect 360 includes a metal line 362 and conducting paths 364-1, 364-2, and 364-3. In this example, metal line 362 extends in lateral direction 322, and may be formed from one of the metal layers 150 (e.g., using a lithographic process and an etching process). It is to be appreciated that the width of the metal line 362 may be larger than shown in FIG. 3B.

Each of the conducting paths 364-1, 364-2, and 364-3 may couple the metal line 362 to a respective one of the first source/drain 330-1, the third source/drain 330-3, and the fifth source/drain 330-5. Each of the conducting paths 364-1, 364-2, and 364-3 may include a source/drain contact, one or more vias (e.g., via VD), and/or one or more portions formed from one or more of the metal layers 150. In FIG. 3B, each of the conducting paths 364-1, 364-2 and 364-3 is represented by an X. It is to be appreciated that the second interconnect 360 is not limited to the example shown in FIG. 3B. It is also to be appreciated that the second interconnect 360 is not limited to the exemplary location shown in FIG. 3B, and that the second interconnect 360 may be placed at various locations on the chip 100 (i.e., die).

FIG. 3B also shows an example of a third interconnect 370 electrically coupling the second source/drain 330-2 and the fourth source/drain 330-4 to one another. In this example, the third interconnect 370 includes a metal line 372 and conducting paths 374-1 and 374-2. In this example, metal line 372 extends in lateral direction 322, and may be formed from one of the metal layers 150 (e.g., using a lithographic process and an etching process). It is to be appreciated that the width of the metal line 372 may be larger than shown in FIG. 3B.

Each of the conducting paths 374-1 and 374-2 may couple the metal line 362 to a respective one of the second source/drain 330-2 and the fourth source/drain 330-4. Each of the conducting paths 354-1 to 354-4 may include a source/drain contact, one or more vias (e.g., via VD), and/or one or more portions formed from one or more of the metal layers 150. In FIG. 3B, each of the conducting paths 374-1 and 374-2 is represented by an X. It is to be appreciated that the third interconnect 370 is not limited to the example shown in FIG. 3B. It is also to be appreciated that the third interconnect 370 is not limited to the exemplary location shown in FIG. 3B, and that the third interconnect 370 may be placed at various locations on the chip 100 (i.e., die).

In certain aspects, the second interconnect 360 may provide a source terminal for the transistor 110 and the third interconnect 370 may provide a drain terminal for the transistor 110, or vice versa.

As discussed above, the chip 100 may include a large number of transistors. To integrate the transistors on the chip, a chip layout is generated specifying the geometries and placements of transistors on the chip. The chip layout may also specify metal routing on the chip. The metal routing may interconnect transistors, couple transistors to a supply rail and/or ground, and the like.

In previous chip layout approaches, transistors are loosely organized by region with little regard given to sharing sources/drains between transistors. These layout approaches result in large parasitic resistances between the transistors, which reduces performance. The large resistances are caused by metal routing for the transistors, which has increased over time as process nodes continue to scale down. Accordingly, an area efficiency layout technique that reduces parasitic resistances is desirable.

Aspects of the present disclosure provide area efficient layout techniques that reduce routing resistance between transistors using source/drain sharing between the transistors, as discussed further below. As used herein. "source/drain sharing" is when transistors share at least one source/drain.

Figure 4:
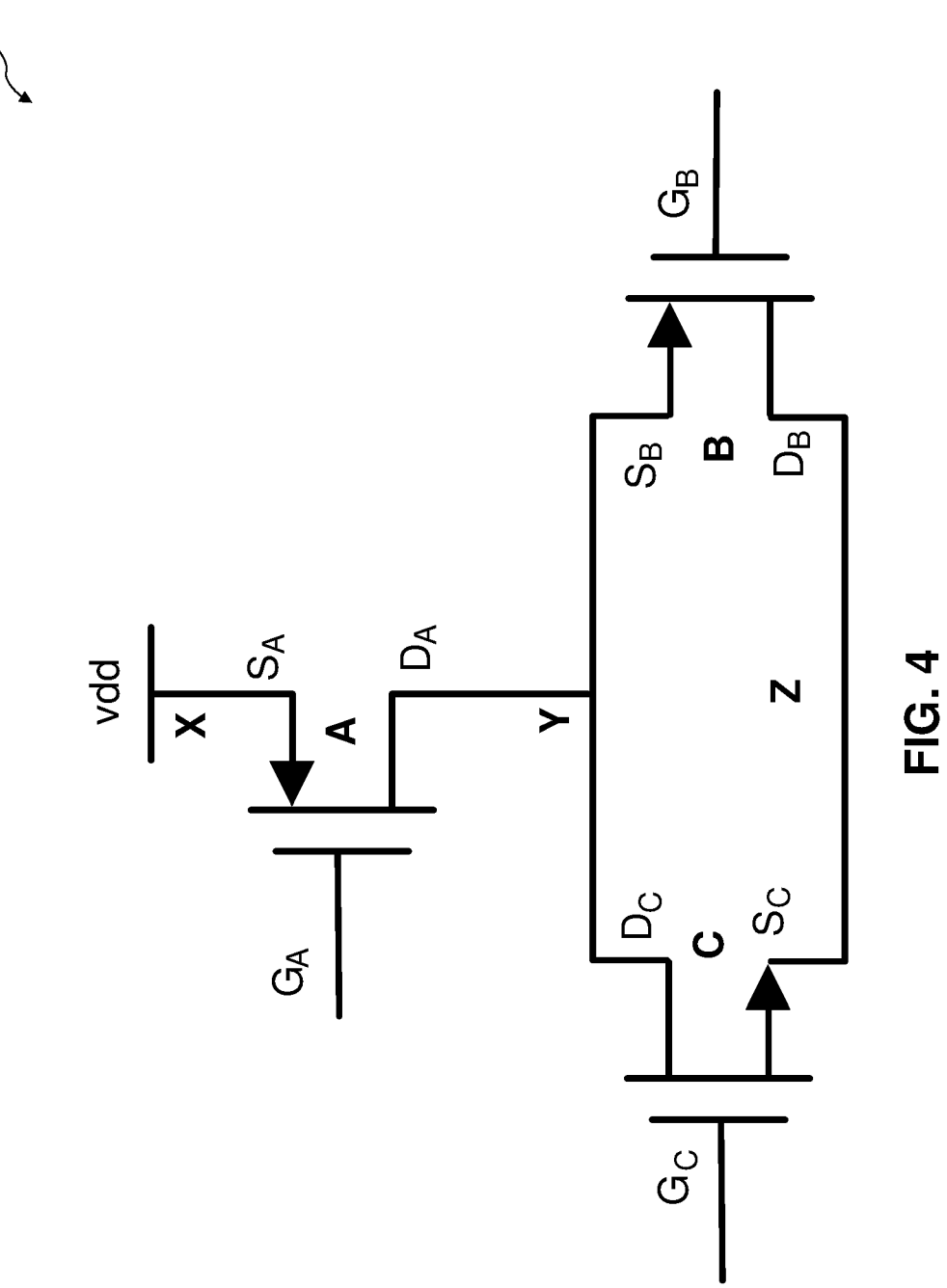
FIG. 4 shows an example of a circuit used to illustrate layout techniques according to certain aspects of the present disclosure.

Layout techniques according to aspects of the present disclosure will now be described below using the exemplary circuit 410 shown in the circuit schematic in FIG. 4. It is to be appreciated that the circuit 410 in FIG. 4 is used solely for the purpose of facilitating a better understanding of the layout techniques according to aspects of the present disclosure. Thus, the layout techniques according to aspects of the present disclosure are not limited to the exemplary circuit 410 shown in FIG. 4, and may be broadly applied to other circuits.

The exemplary circuit 410 shown in FIG. 4 may be part of a power multiplexer (e.g., adaptive power mux). The circuit 410 includes a first transistor A, a second transistor B, and a third transistor C. The first transistor A is between node X and node Y. and the second transistor B and the third transistor C are each between node Y and node Z. Note that a "node" may also be referred to as a "net" or another term. In the example in FIG. 4, the first transistor A is a p-type field effect transistor (PFET), the second transistor B is a PFET, and the third transistor C is an n-type field effect transistor (NFET). However, it is to be appreciated that the present disclosure is not limited to this example.

In certain aspects, the first transistor A and the second transistor B are of the same transistor type (also referred to as channel type). This allows source/drain sharing between the first transistor A and the second transistor B, as discussed further below. In the example in FIG. 4, the first transistor A and the second transistor B are both p-type. However, it is to be appreciated that, in other implementations, the first transistor A and the second transistor B may both be n-type. In this example, the third transistor C is of a different transistor type (i.e., channel type) than the first transistor A and the second transistor B. For the example where the first and second transistors A and B are p-type, the third transistor C is n-type.

In the example in FIG. 4, a source terminal S$_A$ of the first transistor A is coupled to node X, and a drain terminal D$_A$ of the first transistor A is coupled to node Y. A source terminal S$_B$ of the second transistor B is coupled to node Y, and a drain terminal D$_A$ of the second transistor B is coupled to node Z. A drain terminal D$_C$ of the third transistor C is coupled to node Y. and a source terminal S$_C$ of the third transistor C is coupled to node Z.

In certain aspects, each of the first transistor A, the second transistor B, and the third transistor C is implemented with a multi-gate transistor including respective gates (also referred to as fingers). Note that the individual gates of each transistor are not shown in the circuit schematic in FIG. 4. The gates of the first transistor A are coupled to a gate terminal G$_A$ of the first transistor A, the gates of the second transistor B are coupled to a gate terminal G$_B$ of the second transistor B, and of the gates of the third transistor C are coupled to a gate terminal G$_C$ of the third transistor C.

Figure 5:
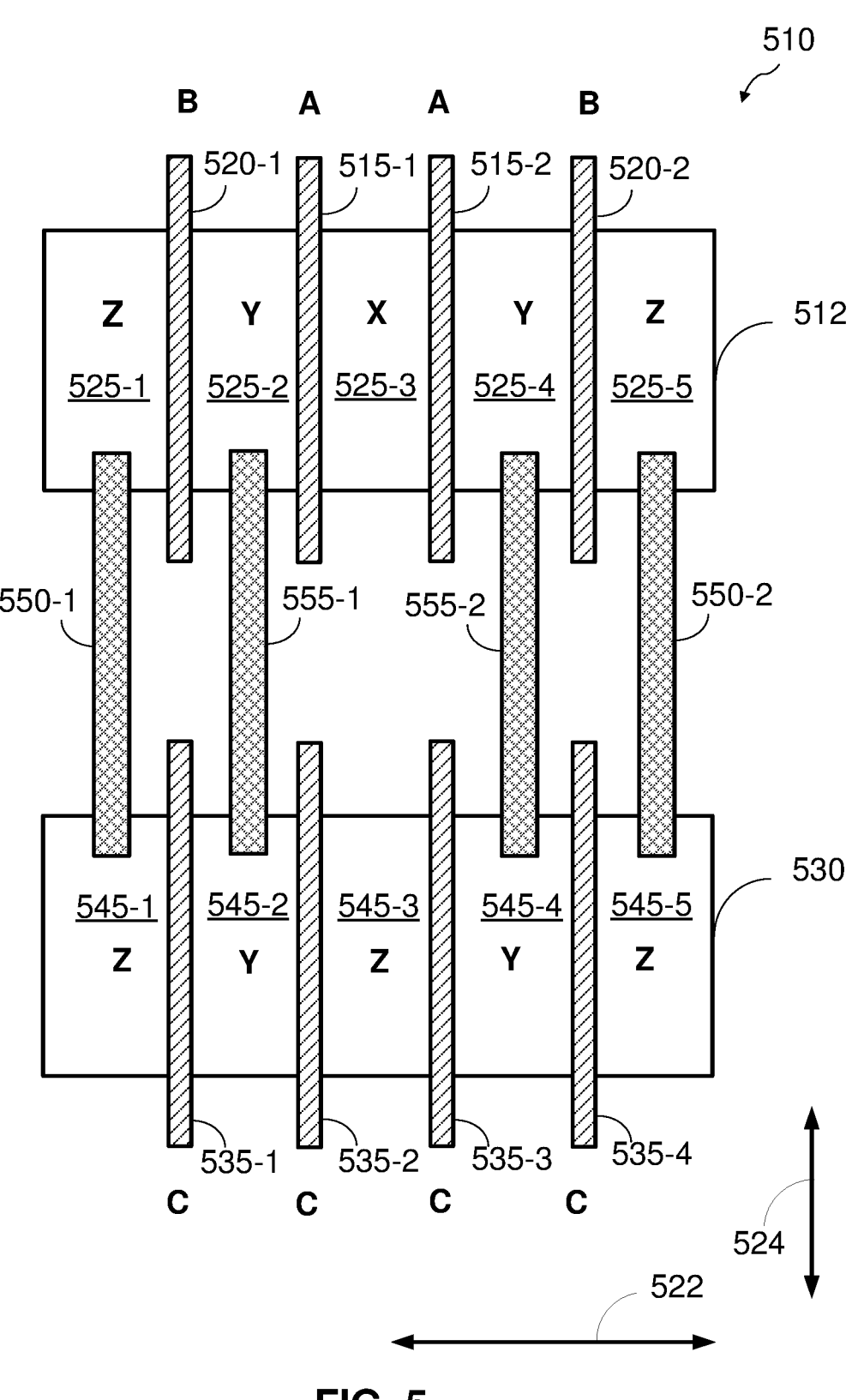
FIG. 5 shows an example of a layout with source/drain sharing according to certain aspects of the present disclosure.

FIG. 5 shows an exemplary layout 510 of the circuit 410 using layout techniques according to aspects of the present disclosure. The layout 510 includes a first active region 512 and a second active region 530. Each active region may also be referred to as oxide diffusion (OD) or another term. For an FinFET process, each of the active regions 512 and 530 may include respective fins (not shown in FIG. 5) extending in lateral direction 522. In this example, the first transistor A and the second transistor B share the first active region 512. As discussed further below, the first active region 512 provides source/drain sharing between the first transistor A and the second transistor B.

The layout 510 also includes first gates 515-1 and 515-2 and second gates 520-1 and 520-2. The first gates 515-1 and 515-2 correspond to the first transistor A and the second gates 520-1 and 520-2 corresponds to the second transistor B. Each of the gates 515-1, 515-2, 520-1 and 520-2 is elongated and extends over the first active region 512 in lateral direction 524. The first gates 515-1 and 515-2 may be coupled to one another by a first gate interconnect (not shown in FIG. 5), and the second gates 520-1 and 520-2 may be coupled to one another by a second gate interconnect (not shown in FIG. 5). Examples of the gate interconnects are discussed further below.

In the example in FIG. 5, the first active region 512 includes a first source/drain 525-1, a second source/drain 525-2, a third source/drain 525-3, a fourth source/drain 525-4, and a fifth source/drain 525-5, in which the sources/drains 525-1 and 525-5 are separated by the gates 515-1, 515-2, 520-1, and 520-2, as shown in FIG. 5. In other words, each of the gates 515-1, 515-2, 520-1 and 520-2 is between a respective pair of the sources/drains 525-1 to 525-5.

In FIG. 5, the letter (i.e., Z, Y, or X) in each source/drain indicates to which node the source/drain is coupled. In this example, the first source/drain 525-1 and the fifth source source/drain 525-5 are coupled to node Z (e.g., by an interconnect), the second source/drain 525-2 and the fourth source/drain 525-4 are coupled to node Y (e.g., by an interconnect), and the third source/drain 525-3 is coupled to node X (e.g., by an interconnect). However, it is to be appreciated that the present disclosure is not limited to this example.

In this example, the second source/drain 525-2 is shared by the first transistor A and the second transistor B, in which the second source/drain 525-2 is between first gate 515-1 and second gate 520-1. The second source/drain 525-2 may act as a drain for the first transistor A and act as a source for the second transistor B. Also, in this example, the fourth source/drain 525-4 is shared by the first transistor A and the second transistor B, in which the fourth source/drain 525-4 is between first gate 515-2 and second gate 520-2. The fourth source/drain 525-4 may act as a drain for the first transistor A and act as a source for the second transistor B. However, it is to be appreciated that the present disclosure is not limited to this example.

Thus, in this example, the second source/drain 525-2 and the fourth source/drain 525-4 provide source/drain sharing between the first transistor A and the second transistor B. The source/drain sharing between the first transistor A and the second transistor B may eliminate or reduce the need for metal routing between the first transistor A and the second transistor B, which may eliminate or reduce metal routing resistance between the first transistor A and the second transistor B. This significantly reduces parasitic resistance compared with layout approaches that do not use source/drain sharing.

In the example in FIG. 5, the layout 510 also includes third gates 535-1 to 535-4 corresponding to the third transistor C. Each of the third gates 535-1 to 535-4 is elongated and extends over the second active region 530 in lateral direction 524. The third gates 535-1 to 535-4 may be coupled to one another by a third gate interconnect (not shown in FIG. 5).

In the example in FIG. 5, the second active region 530 includes sources/drains 545-1 to 545-5 that are separated by the third gates 535-1 and 535-5. In other words, each of the third gates 535-1 to 535-5 is between a respective pair of the sources/drains 545-1 to 545-5. In FIG. 5, the letter (i.e., Z or Y) in each source/drain indicates to which node the source/drain is coupled.

In certain aspects, the sources/drains 525-1 and 525-5 in the first active region 512 may be coupled to the sources/drains 545-1 and 545-5 in the second active region 530 since the sources/drains 525-1, 525-5, 545-1, and 545-5 are coupled to node Z. In this regard, FIG. 5 shows an example of metal routing 550-1 coupling sources/drains 525-1 and 545-1 and metal routing 550-2 coupling sources/drains 525-5 and 545-5. The metal routings 550-1 and 550-2 may be part of an interconnect coupling the sources/drains 525-1, 525-5, 545-1, and 545-5 to one another. The interconnect may include source/drain contacts, vias (e.g., vias VD), and/or one or more metal lines formed from one or more of the metal layers 150.

In certain aspects, the sources/drains 525-2 and 525-4 in the first active region 512 may be coupled to the sources/drains 545-2 and 545-4 in the second active region 530 since the sources/drains 525-2, 525-4, 545-2, and 545-4 are coupled to the node Y. In this regard. FIG. 5 shows an example of metal routing 555-1 coupling sources/drains 525-2 and 545-2 and metal routing 555-2 coupling sources/drains 525-4 and 545-4. The metal routings 555-1 and 555-2 may be part of an interconnect coupling the sources/drains 525-2, 525-4, 545-2, and 545-4 to one another. The interconnect may include source/drain contacts, vias (e.g., vias VD), and/or one or more metal lines formed from one or more of the metal layers 150.

The exemplary layout 510 shown in FIG. 5 illustrates various layout features according to aspects of the present disclosure. For example, in certain aspects, the number of first gates 515-1 and 515-2 is even and the number of second gates 520-1 and 520-2 is even (i.e., each of the first and second transistors A and B has an even number of gates). This feature helps make the sources/drains 525-1 and 525-5 on both sides of the first active region 512 coupled to the same node (e.g., node Z). Having the sources/drains 525-1 and 525-5 on both sides coupled to the same node allows the layout 510 to be repeated in lateral direction 522 to increase the sizes of the transistors A and B. An example of this is illustrated in FIG. 6.

Figure 6:
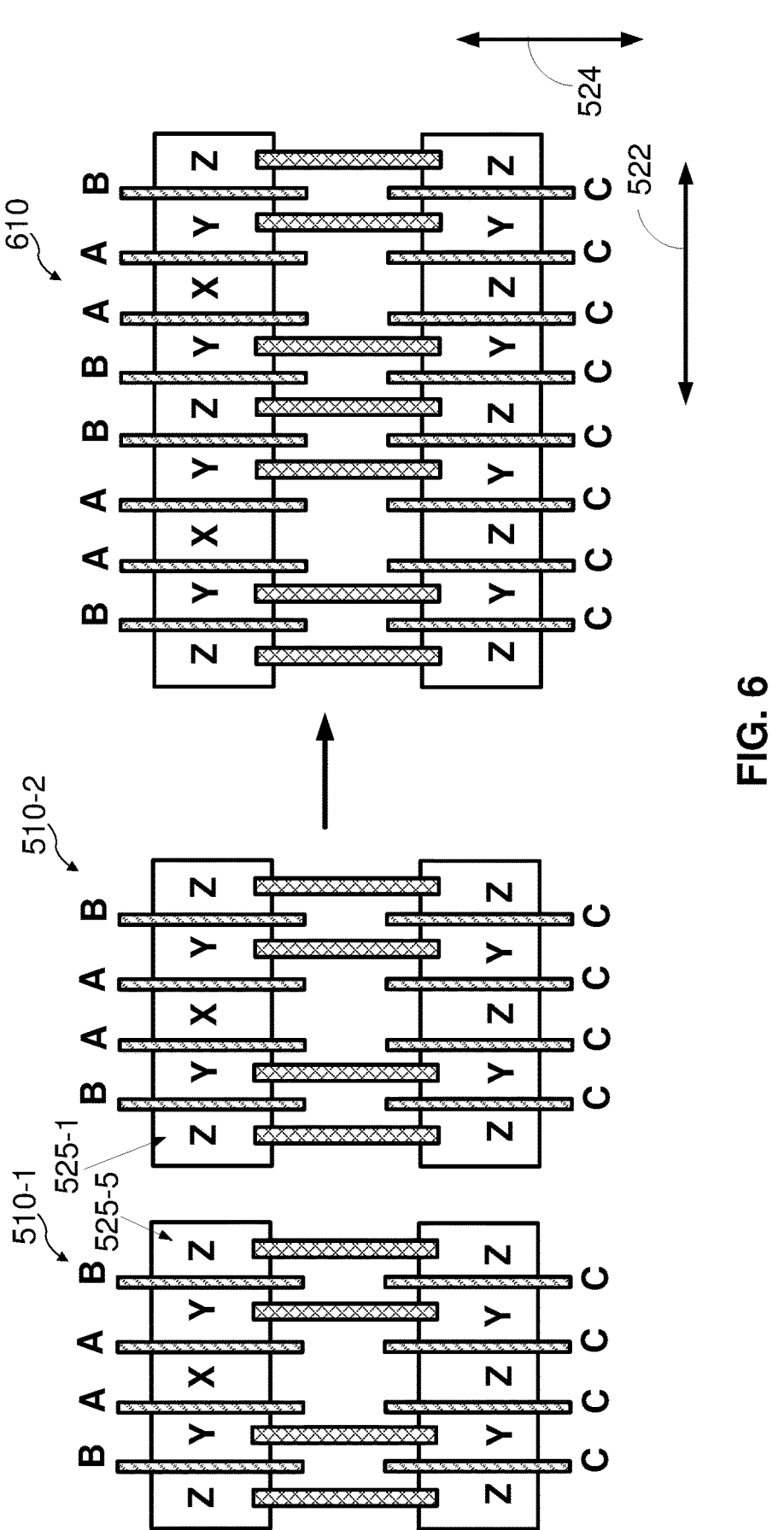
FIG. 6 shows an example in which the exemplary layout in FIG. 5 is repeated according to certain aspects of the present disclosure.

FIG. 6 shows an example of a first layout 510-1 and a second layout 510-2, where each of the first and second layouts 510-1 and 510-2 is a copy of the exemplary layout 510. As shown in FIG. 6, the source/drain 525-5 on the right side of the first layout 510-1 and the source/drain 525-1 on the left side of the second layout 510-2 are both coupled to node Z. This allows the first and second layouts 510-1 to 510-2 to be combined to form the combined layout 610 shown in FIG. 6. Note that, in this example, the source/drain 525-5 on the right side of the first layout 510-1 and the source/drain 525-1 on the left side of the second layout 510-2 are merged in the combined layout 610. It is to be appreciated that the layout 510 may repeated any number of times in the manner illustrated in FIG. 6 to increase the sizes of the transistors A and B.

Thus, having an even number of first gates 515-1 and 515-2 and an even number of second gates 520-1 to 520-2 helps make the sources/drains 525-1 and 525-5 on both sides of the first active region 512 coupled to the same node (e.g., node Z), which allows the layout 510 to be repeated to increase the sizes of the transistors A and B.

Figure 7B:
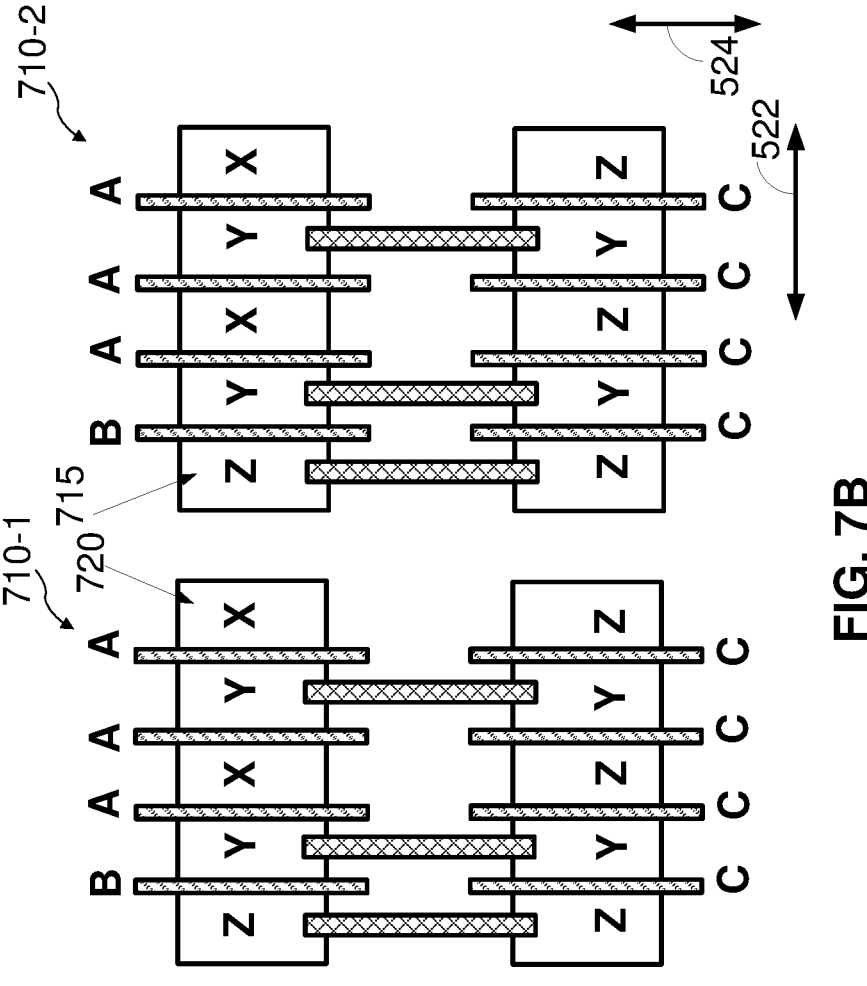
FIG. 7B shows an example in which the odd number of gates prevents the layout in FIG. 7B from being repeated in a horizontal direction according to certain aspects of the present disclosure.
Figure 7A:
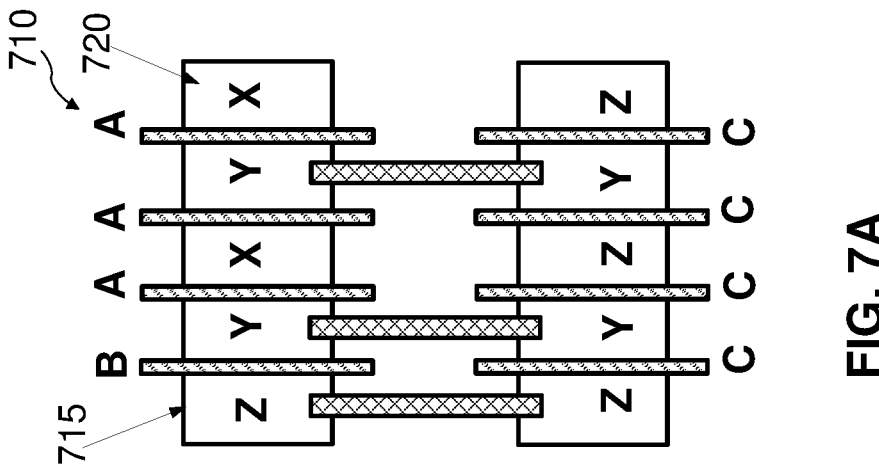
FIG. 7A shows an example of a layout with an odd number of gates for a transistor according to certain aspects of the present disclosure.

In contrast, FIG. 7A shows an example of a layout 710 in which there is an odd number of gates (e.g., three) for the first transistor A. This causes the source/drain 715 on the left side to be coupled to a different node than the source/drain 720 on the right side (i.e., the source/drain 715 is coupled to node Z while the source/drain 720 is coupled to node X). This prevents the layout 710 from being repeated in lateral direction 522 to form a combined layout. An example of this is illustrated in FIG. 7B, which shows a first layout 710-1 and a second layout 710-2, where each of the first and second layouts 710-1 and 710-2 is a copy of the exemplary layout 710. As shown in FIG. 7A, the source/drain 720 on the right side of the first layout 710-1 and the source/drain 715 on the left side of the second layout 710-2 are coupled to different nodes, which prevents the layouts 710-1 and 710-2 from being combined in the manner illustrated in FIG. 6.

In the example in FIG. 5, the ratio of the number of gates of the first transistor A (i.e., first gates 515-1 and 515-2) to the number of gates of the second transistor B (i.e., second gates 520-1 and 520-2) is 2:2. However, it is to be appreciated that the present disclosure is not limited to this example, and that other ratios may be used. Examples of other ratios that may be used include the following: 2:6, 6:2, 4:4, 4:6, 4:8, etc. For each of these ratios, the number of gates for the first transistor A is even and the number of gates for the second transistor B is even. Examples of other ratios that may be used are discussed further below according to certain aspects.

In certain aspects, the number of gates of the third transistor C (i.e., third gates 535-1 to 535-4) is equal to the sum of the number of gates of the first transistor A (i.e., first gates 515-1 and 515-2) and the number of gates of the second transistor B (i.e., second gates 520-1 to 520-2). In other words, the number of gates of the third transistor C equals number of gates of the first transistor A plus the number of gates of the second transistor B. This feature helps match the width of the first active region 512 with the width of the second active region 530 in lateral direction 522, which helps reduce areas on the chip 100 with dummy gates due to mismatch between the widths of the active regions 512 and 530.

In the example in FIG. 5, the second gates 520-1 and 520-2 are interspersed across the first active region 512. As used herein, the second gates 520-1 and 520-2 are interspersed across the first active region 512 when two of the second gates 520-1 and 520-2 are separated by one or more intervening first gates 515-1 and 515-2. In the example shown in FIG. 5, second gates 520-1 and 520-2 are separating by first gates 515-1 and 515-2. However, it is to be appreciated that the present disclosure is not limited to this example.

Figure 8:
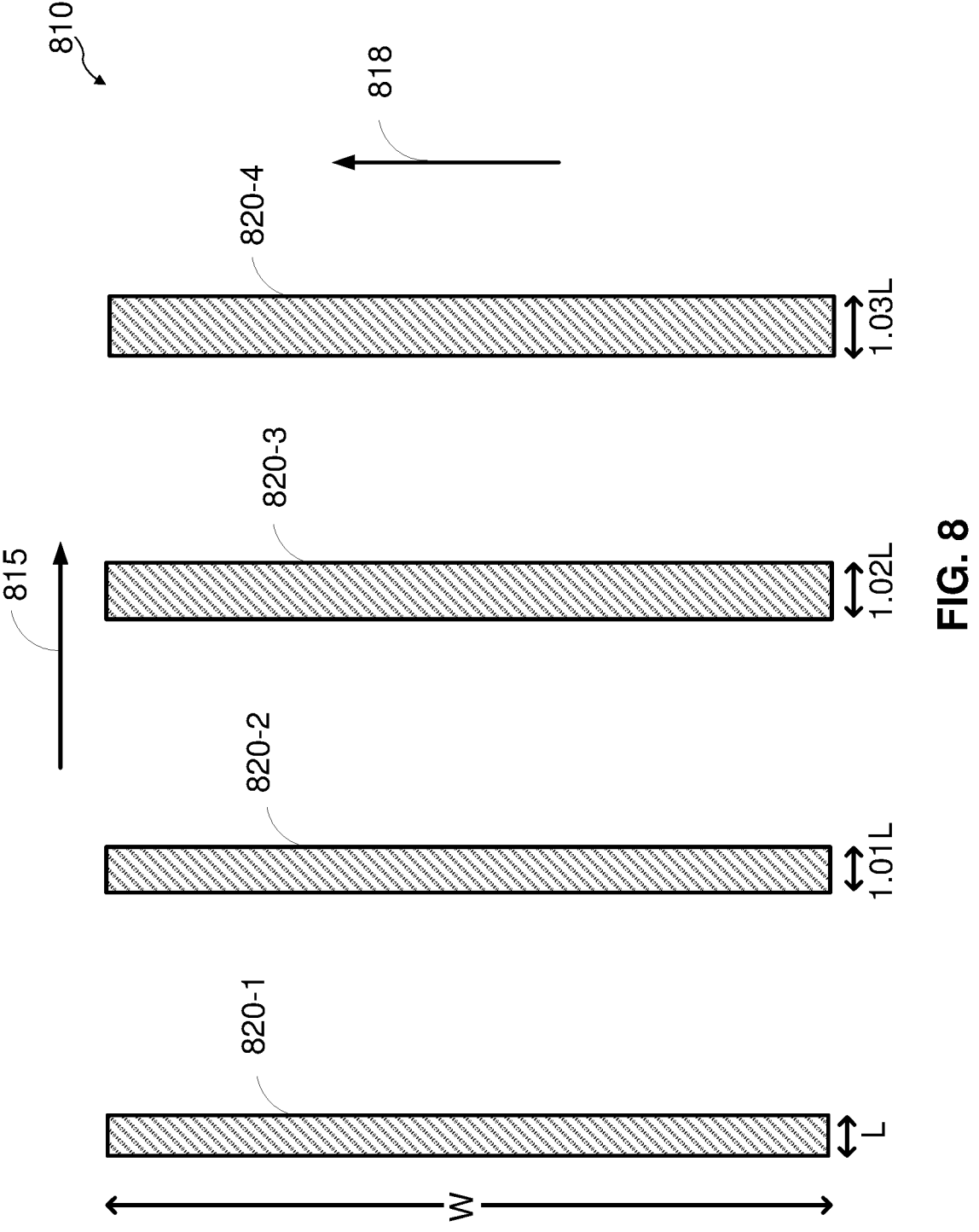
FIG. 8 shows an example of an effect of process variation on gate length according to certain aspects of the present disclosure.

In this example, interspersing the second gates 520-1 and 520-2 helps reduce mismatches between the first gates 515-1 and 515-2 and the second gates 520-1 and 520-2 due to process variation. This is because interspersing the second gates 520-1 and 520-2 helps cause the first gates 515-1 and 515-2 and the second gates 520-1 and 520-2 to be more equally affected by process variation. An example of this is illustrated in FIG. 8, which shows an example of the effects of process variation on the lengths of gates 820-1 to 820-4. Note that, in this example, the length (labeled "L") of each of the gates 820-1 to 820-4 is in direction 815. In this example, the gates 820-1 to 820-4 ideally have the same length. However, due to process variation during fabrication, the lengths of the gates 820-1 to 820-4 slightly increase in direction 815 (i.e., moving from left to right in FIG. 8). In the example shown in FIG. 8, gate 820-1 may have a length of L, gate 820-2 may have a length of 1.01 L, gate 820-3 may have a length of 1.02 L, and gate 820-4 may have a length of 1.03 L due to process variation. Note that the differences in the lengths of the gates 820-1 to 820-4 are exaggerated in FIG. 8 for ease of illustration.

For the example illustrated in FIG. 8, interspersing the second gates 520-1 and 520-2 helps reduce mismatches in the lengths of the first gates 515-1 and 515-2 and the second gates 520-1 and 520-2 due to the process variation. Assuming the second gates 520-1 and 520-2 correspond to gates 820-1 and 820-4 and the first gates 515-1 and 515-2 correspond to gates 820-2 and 820-3, the average length of the second gates 520-1 to 520-2 is 1.015 L and the average length of the first gates 515-1 to 515-2 is also 1.015 L in this example. Thus, in this example, interspersing the second gates 520-1 and 520-2 causes the average length of the second gates 520-1 and 520-2 to match the average length of the first gates 515-1 and 515-2.

Therefore, interspersing the second gates 520-1 and 520-2 reduces mismatches in the lengths of the gates 515-1, 515-2, 520-1, and 520-2 due to process variation. It is to be appreciated that interspersing the second gates 520-1 and 520-2 may also reduce mismatches in the widths of the gates 515-1, 515-2, 520-1, and 520-2 due to process variation, in which the width (labeled "W") of each gate is in direction 818.

It is to be appreciated that mismatches due to process variation may also be reduced by interspersing the first gates 515-1 and 515-2 across the first active region 512. As used herein, the first gates 515-1 and 515-2 are interspersed across the first active region 512 when two of the first gates 515-1 and 515-2 are separated by one or more intervening second gates 520-1 and 520-2. Examples in which the first gates are interspersed are discussed below.

Figure 9A:
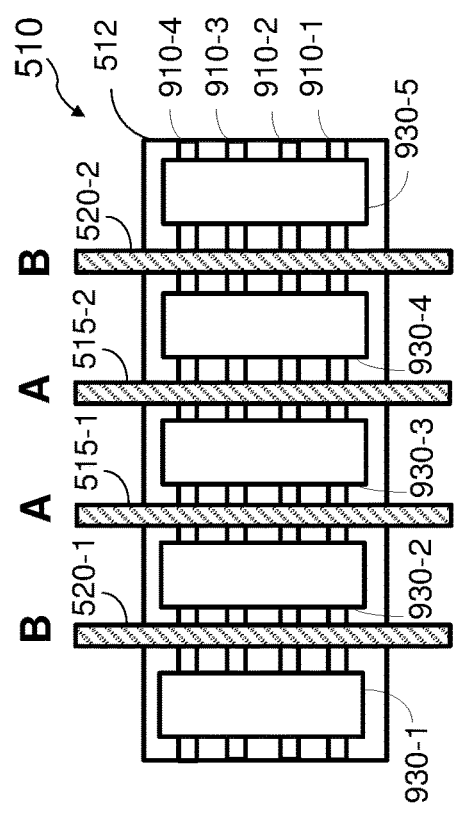
FIG. 9A shows an example of fins according to certain aspects of the present disclosure.
Figure 9A:
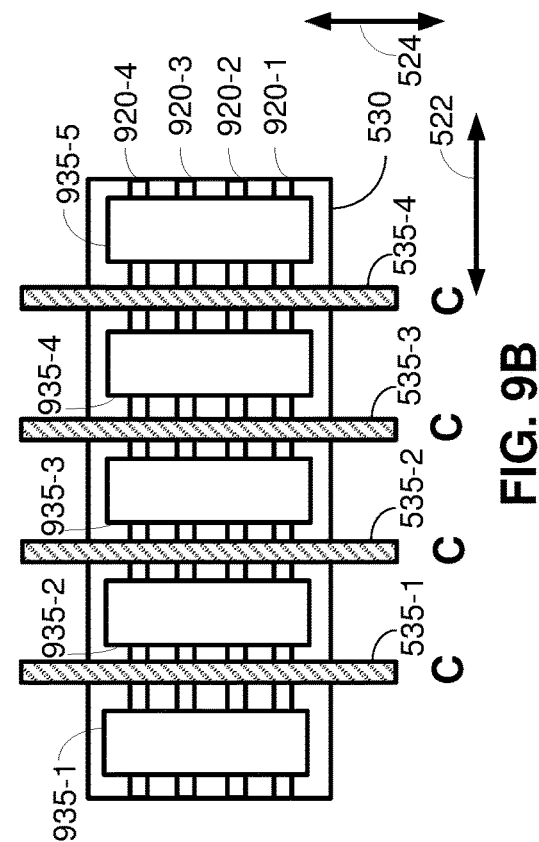
Figure 9A:
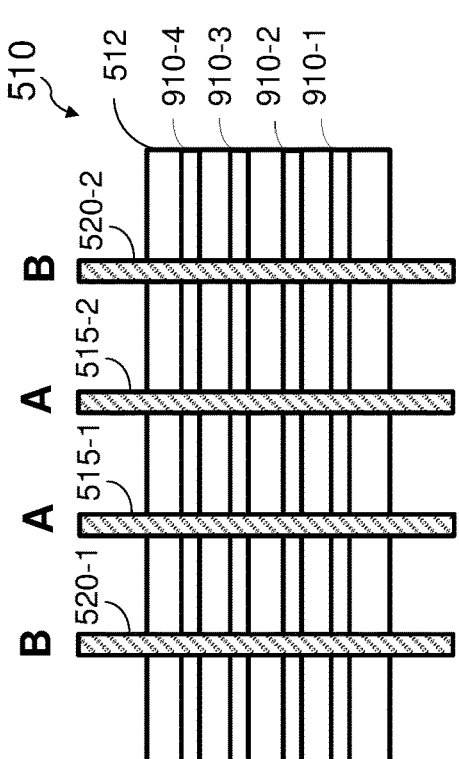

As discussed above, for a FinFET process, each of the active regions 512 and 530 includes fins. In this regard. FIG. 9A shows an example in which the first active region 512 includes first fins 910-1 to 910-4, and the second active region 530 includes second fins 920-1 to 920-4. Note that the reference numbers for the sources/drains 525-1 to 525-5 and 545-1 to 545-5 are not shown in FIG. 9A for ease of illustration.

In this example, each of the first fins 910-1 to 910-4 is elongated and extends in lateral direction 522. The first gates 515-1 and 515-2 and the second gates 520-1 and 520-2 are formed over the first fins 910-1 to 910-4. Each of the first fins 910-1 to 910-4 is contiguous in the first active region 512. It is to be appreciated that the present disclosure is not limited to the number of first fins 910-1 to 910-4 shown in the example in FIG. 9A.

In this example, each of the second fins 920-1 to 920-4 is elongated and extends in lateral direction 522. The third gates 535-1 to 535-4 are formed over the second fins 920-1 to 9204. Each of the second fins 920-1 to 920-4 is contiguous in the second active region 530. It is to be appreciated that the present disclosure is not limited to the number of second fins 920-1 to 920-4 shown in the example in FIG. 9A.

Figure 9B:
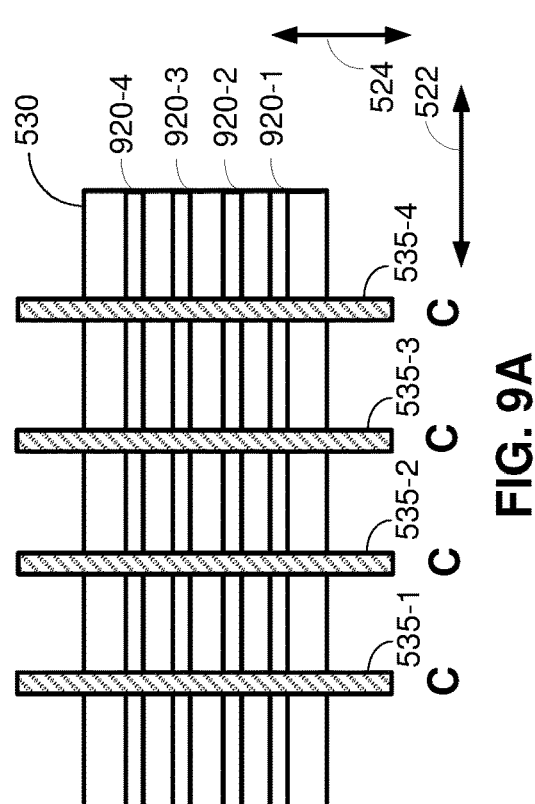
FIG. 9B shows an example of source/drain contacts according to certain aspects of the present disclosure.

FIG. 9B shows an example of first source/drain contacts 930-1 to 930-5 formed over the first fins 910-1 to 910-4 to provide contacts for the sources/drains 525-1 to 525-5, respectively. The metal routings 550-1, 550-2, 555-1, and 555-2 (not shown in FIG. 9B) may couple to the sources/drains 525-1, 525-2, 525-4, and 525-5 through the respective source/drain contacts 930-1, 930-2, 930-4, and 930-5.

FIG. 9B also shows an example of second source/drain contacts 935-1 to 935-5 formed over the second fins 920-1 to 920-4 to provide contacts for the sources/drains 545-1 to 545-5, respectively. The metal routings 550-1, 550-2, 555-1, and 555-2 (not shown in FIG. 9B) may couple to the sources/drains 545-1, 545-2, 545-4, and 545-5 through the respective source/drain contacts 935-1, 935-2, 935-4, and 935-5.

Figure 10:
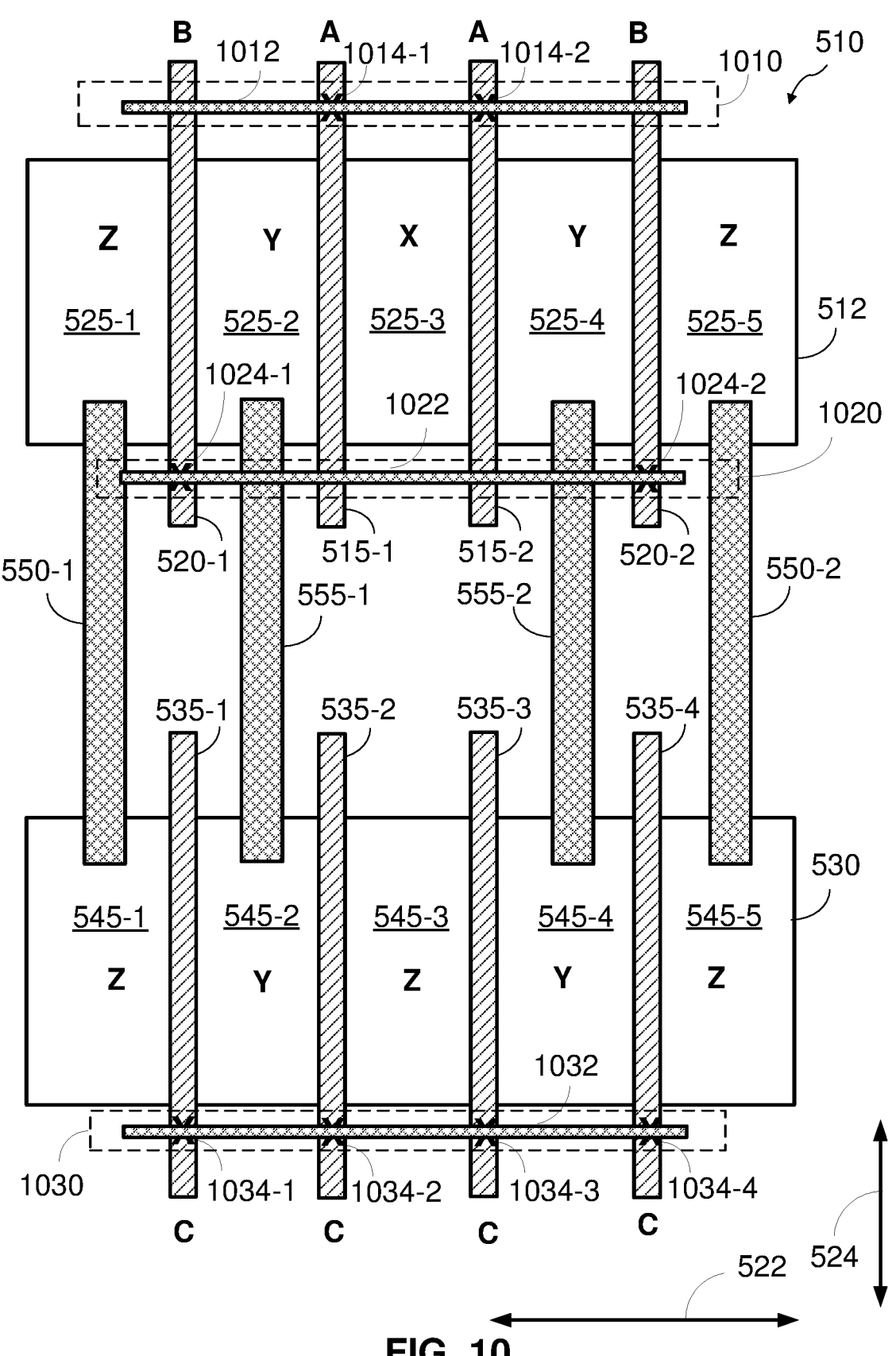
FIG. 10 shows an example of gate interconnects according to certain aspects of the present disclosure.

As discussed above, the first gates 515-1 and 515-2 may be coupled to one another by a first gate interconnect, the second gates 520-1 and 520-2 may be coupled to one another by a second gate interconnect, and the third gates 535-1 to 535-4 may be coupled to one another by a third gate interconnect. In this regard, FIG. 10 shows an example of a first gate interconnect 1010, a second gate interconnect 1020, and a third gate interconnect 1030 according to certain aspects.

In this example, the first gate interconnect 1010 includes a metal line 1012 and conducting paths 1014-1 and 1014-2. In this example, the metal line 1012 extends across the first gates 515-1 and 515-2 in lateral direction 522. The metal line 1012 may be formed from one of the metal layers 150 (e.g., using a lithographic process and an etching process). It is to be appreciated that the width of the metal line 1012 may be larger than shown in FIG. 10. Each of the conducting paths 1014-1 and 1014-2 (represented by an X) may couple a respective one of the first gates 515-1 and 515-2 to the metal line 1012. Each of the conducting paths 1014-1 and 1014-2 may include a gate contact, one or more vias (e.g., via VG), and/or one or more portions formed from one or more of the metal layers 150. It is to be appreciated that the first gate interconnect 1010 is not limited to the example shown in FIG. 10. It is also to be appreciated that the first gate interconnect 1010 is not limited to the exemplary location shown in FIG. 10. For example, in some implementations, the first gate interconnect 1010 may be placed on the other side of the first active region 512, or another location.

In this example, the second gate interconnect 1020 includes a metal line 1022 and conducting paths 1024-1 and 1024-2. In this example, the metal line 1022 extends across the second gates 520-1 and 520-2 in lateral direction 522. The metal line 1022 may be formed from one of the metal layers 150 (e.g., using a lithographic process and an etching process). It is to be appreciated that the width of the metal line 1022 may be larger than shown in FIG. 10. Each of the conducting paths 1024-1 and 1024-2 (represented by an X) may couple a respective one of the second gates 520-1 and 520-2 to the metal line 1022. Each of the conducting paths 1024-1 and 1024-2 may include a gate contact, one or more vias (e.g., via VG), and/or one or more portions formed from one or more of the metal layers 150. It is to be appreciated that the second gate interconnect 1020 is not limited to the example shown in FIG. 10. It is also to be appreciated that the second gate interconnect 1020 is not limited to the exemplary location shown in FIG. 10. For example, in some implementations, the second gate interconnect 1020 may be placed on the other side of the first active region 512, or another location.

In this example, the third gate interconnect 1030 includes a metal line 1032 and conducting paths 1034-1 to 1034-4. In this example, the metal line 1032 extends across the third gates 535-1 to 535-4 in lateral direction 522. The metal line 1032 may be formed from one of the metal layers 150 (e.g., using a lithographic process and an etching process). It is to be appreciated that the width of the metal line 1032 may be larger than shown in FIG. 10. Each of the conducting paths 1034-1 to 1034-4 (represented by an X) may couple a respective one of the third gates 535-1 to 535-4 to the metal line 1032. Each of the conducting paths 1034-1 to 1034-4 may include a gate contact, one or more vias (e.g., via VG), and/or one or more portions formed from one or more of the metal layers 150. It is to be appreciated that the third gate interconnect 1030 is not limited to the example shown in FIG. 10. It is also to be appreciated that the third gate interconnect 1030 is not limited to the exemplary location shown in FIG. 10. For example, in some implementations, the third gate interconnect 1030 may be placed on the other side of the second active region 530, or another location.

Figure 11:
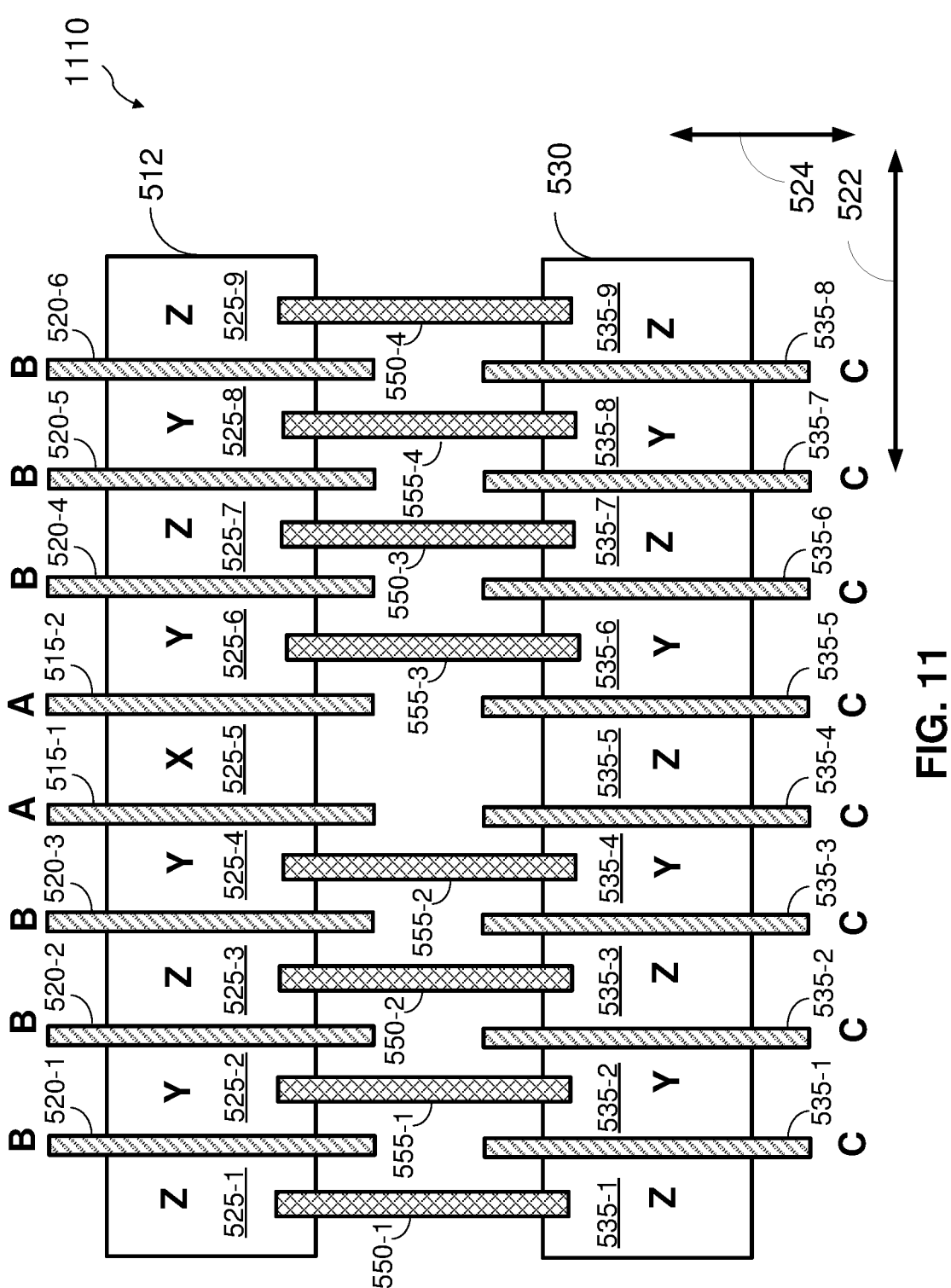
FIG. 11 shows an example of a layout with a gate ratio of 2:6 between a first transistor and second transistor according to certain aspects of the present disclosure.

As discussed above, different ratios may be used for the number of gates of the first transistors A to the number of gates of the second transistor B. In this regard, FIG. 11 shows an example of a layout 1110 where the ratio is 2:6. In this example, the first gates 515-1 and 515-2 are placed between second gates 520-1 to 520-3 and second gates 520-4 to 540-6. The source/drain 525-4 between first gate 515-1 and second gate 520-3 is shared by the first and second transistors A and B. and the source/drain 525-6 between first gate 515-2 and second gate 520-4 is shared by the first and second transistors A and B. As discussed above, the source/drain sharing between the first and second transistors A and B reduces parasitic resistance.

In this example, the number of the first gates 515-1 and 515-2 is even (i.e., two) and the number of the second gates 520-1 to 520-6 is even (i.e., six). The source/drain 525-1 on the left side of the first active region 512 and the source/drain 525-9 on the right side of the active region 512 are coupled to the same node (i.e., node Z), which allows the layout 1110 to be repeated in lateral direction 522 to form a larger layout. Also, in this example, the number of the third gates 535-1 to 535-8 (i.e., eight) is equal to the sum of the number of the first gates 515-1 and 515-2 and the number of the second gates 520-1 to 520-6. As discussed above, this helps prevent areas with dummy gates caused by mismatches in the widths of the first active region 512 and the second active region 530.

Figure 12:
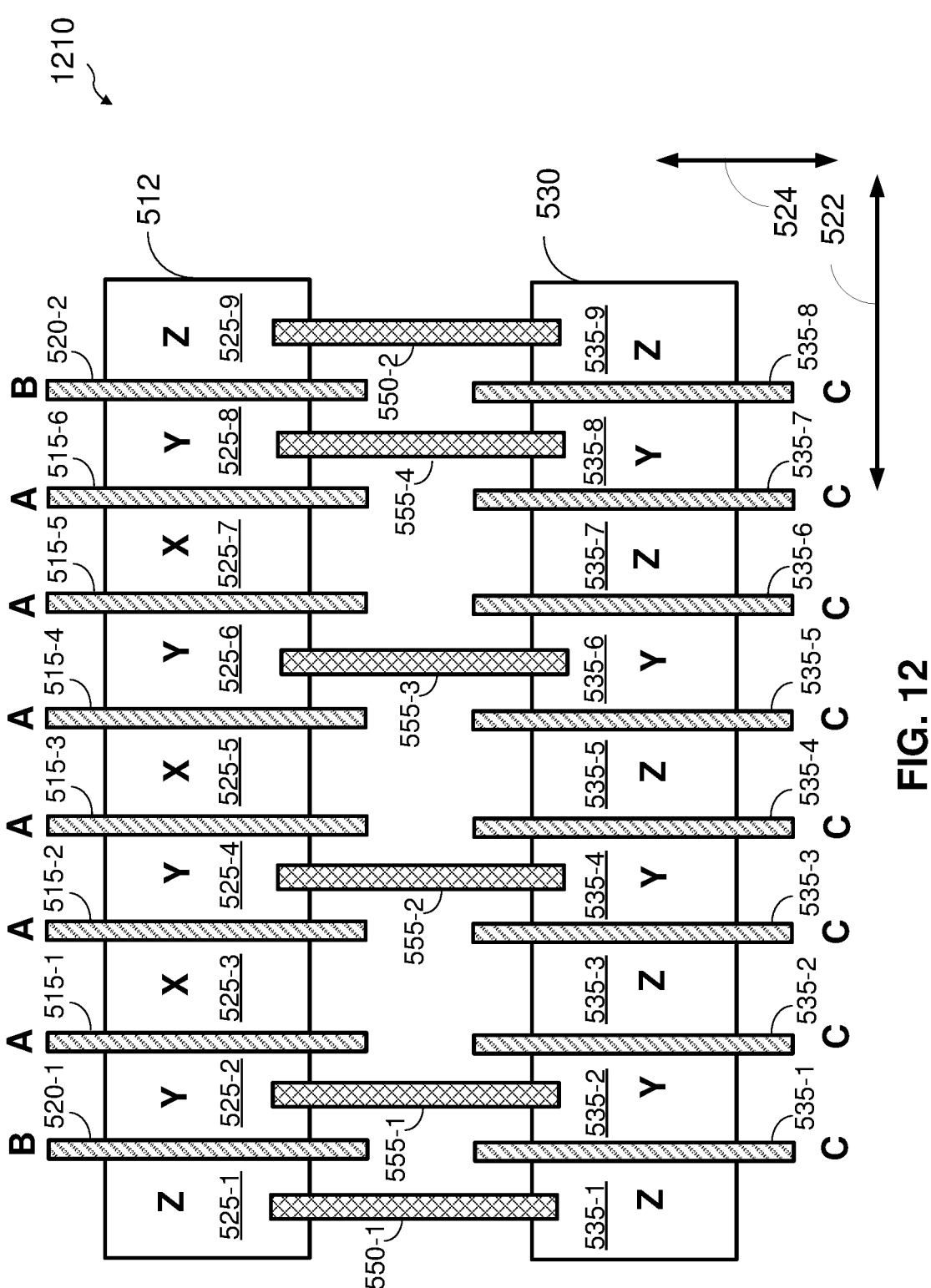
FIG. 12 shows an example of a layout with a gate ratio of 6:2 between a first transistor and second transistor according to certain aspects of the present disclosure.

FIG. 12 shows an example of a layout 1210 where the ratio is 6:2. In this example, the first gates 515-1 to 515-6 are placed between second gates 520-1 and 520-2. The source/drain 525-2 between first gate 515-1 and second gate 520-1 is shared by the first and second transistors A and B, and the source/drain 525-8 between first gate 515-6 and second gate 520-2 is shared by the first and second transistors A and B.

In this example, the number of the first gates 515-1 to 515-6 is even (i.e., six) and the number of the second gates 520-1 and 520-2 is even (i.e., two). The source/drain 525-1 on the left side of the first active region 512 and the source/drain 525-9 on the right side of the active region 512 are coupled to the same node (i.e., node Z). Also, in this example, the number of the third gates 535-1 to 535-8 (i.e., eight) is equal to the sum of the number of the first gates 515-1 and 515-2 and the number of the second gates 520-1 to 520-6.

Figure 13:
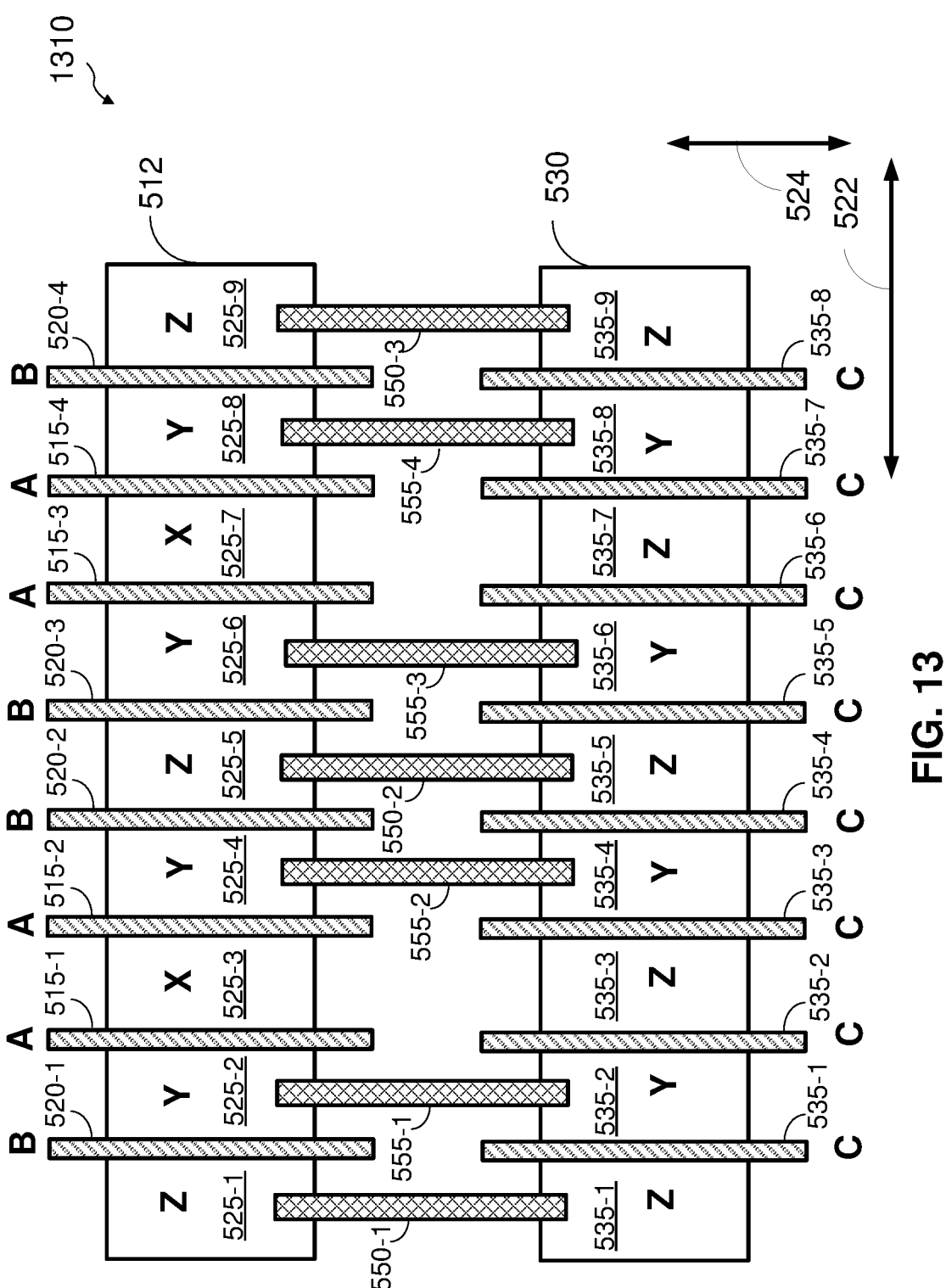
FIG. 13 shows an example of a layout with a gate ratio of 4:4 between a first transistor and second transistor according to certain aspects of the present disclosure.

FIG. 13 shows an example of a layout 1310 where the ratio is 4:4. In this example, the first gates 515-1 to 515-4 and the second gates 520-1 to 520-4 are interspersed across the first active region 512. First gates 515-1 and 515-2 are between second gates 520-1 and 520-2, second gates 520-2 and 520-3 are between first gates 515-2 and 515-3, and first gates 515-3 and 515-4 are between second gates 520-3 and 520-4. The source/drain 525-2 between first gate 515-1 and second gate 520-1 is shared by the first and second transistors A and B, the source/drain 525-4 between first gate 515-2 and second gate 520-2 is shared by the first and second transistors A and B, the source/drain 525-6 between first gate 515-3 and second gate 520-3 is shared by the first and second transistors A and B, and the source/drain 525-8 between first gate 515-4 and second gate 520-4 is shared by the first and second transistors A and B.

In this example, the number of the first gates 515-1 to 515-4 is even (i.e., four) and the number of the second gates 520-1 to 520-4 is even (i.e., four). The source/drain 525-1 on the left side of the first active region 512 and the source/drain 525-9 on the right side of the active region 512 are coupled to the same node (i.e., node Z). Also, in this example, the number of the third gates 535-1 to 535-8 (i.e., eight) is equal to the sum of the number of the first gates 515-1 to 515-4 and the number of the second gates 520-1 to 520-4.

Figure 14:
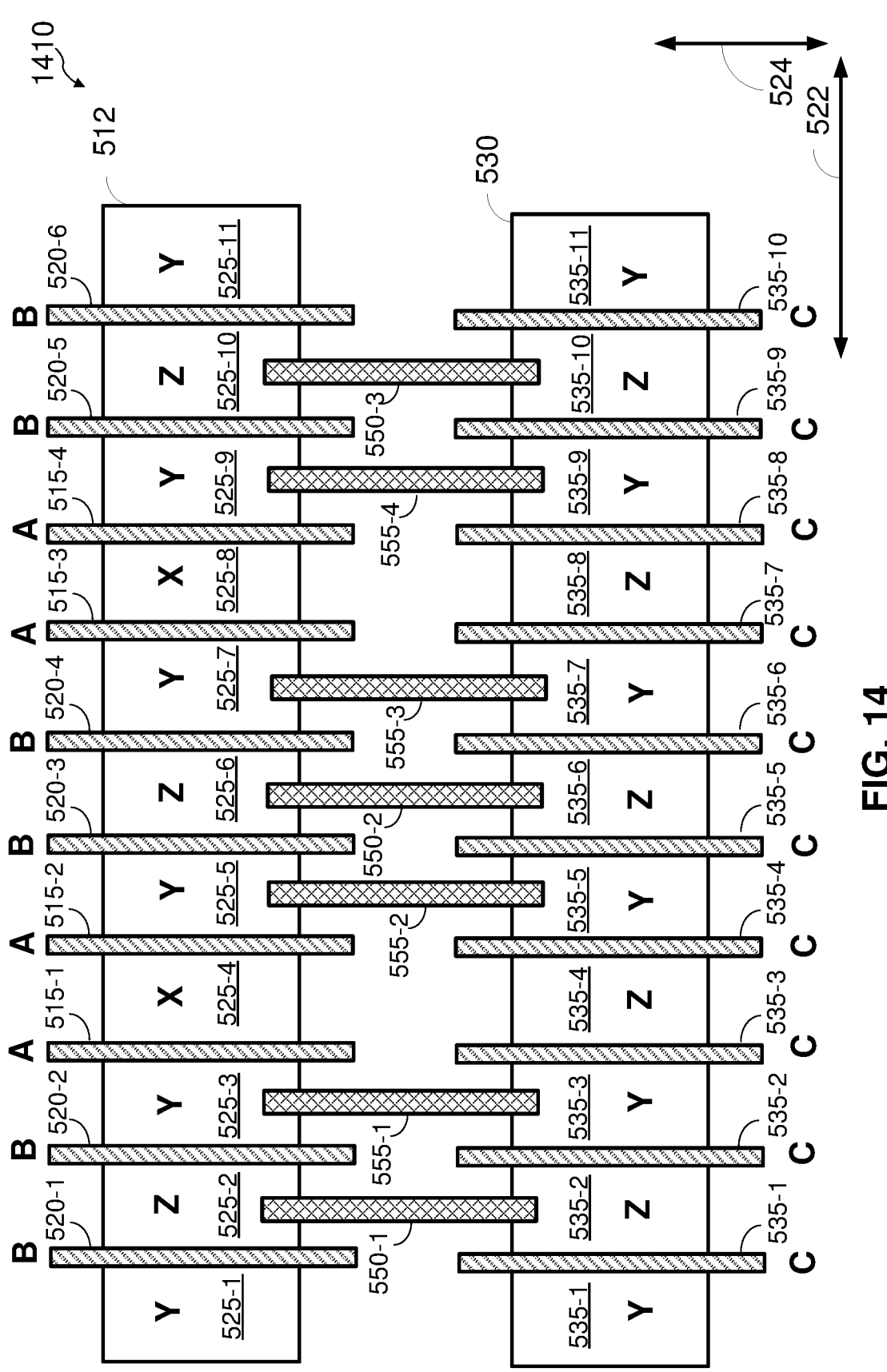
FIG. 14 shows an example of a layout with a gate ratio of 4:6 between a first transistor and second transistor according to certain aspects of the present disclosure.

FIG. 14 shows an example of a layout 1410 where the ratio is 4:6. In this example, the first gates 515-1 to 515-4 and the second gates 520-1 to 520-6 are interspersed across the first active region 512. First gates 515-1 and 515-2 are between second gates 520-2 and 520-3, second gates 520-3 and 520-4 are between first gates 515-2 and 515-3, and first gates 515-3 and 515-4 are between second gates 520-4 and 520-5. The source/drain 525-3 between first gate 515-1 and second gate 520-2 is shared by the first and second transistors A and B, the source/drain 525-5 between first gate 515-2 and second gate 520-3 is shared by the first and second transistors A and B, the source/drain 525-7 between first gate 515-3 and second gate 520-4 is shared by the first and second transistors A and B, and the source/drain 525-9 between first gate 515-4 and second gate 520-5 is shared by the first and second transistors A and B.

In this example, the number of the first gates 515-1 to 515-4 is even (i.e., four) and the number of the second gates 520-1 to 520-6 is even (i.e., six). The source/drain 525-1 on the left side of the first active region 512 and the source/drain 525-11 on the right side of the active region 512 are coupled to the same node (i.e., node Y). Also, in this example, the number of the third gates 535-1 to 535-10 (i.e., ten) is equal to the sum of the number of the first gates 515-1 to 515-4 and the number of the second gates 520-1 to 520-6.

Figure 15:
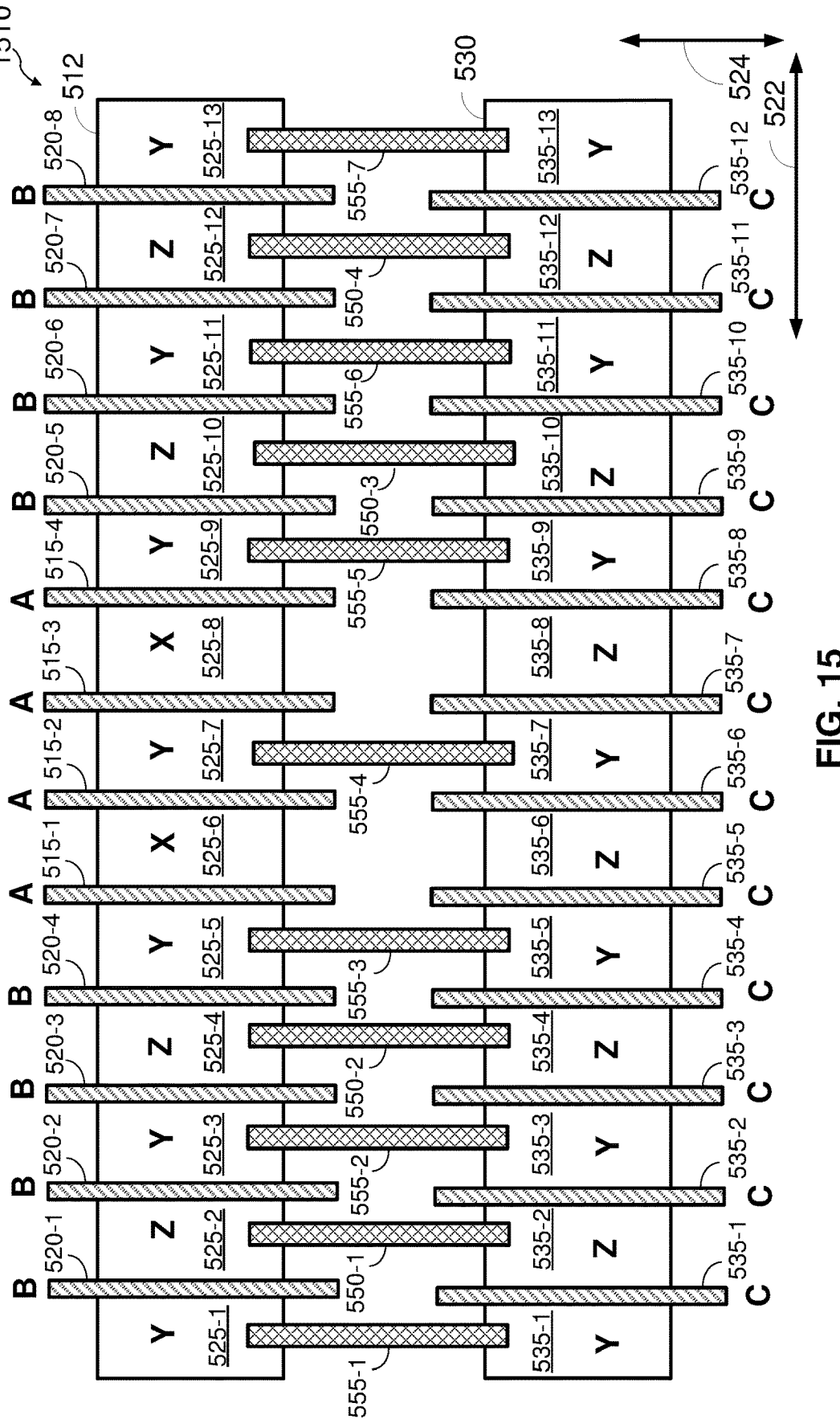
FIG. 15 shows an example of a layout with a gate ratio of 4:8 between a first transistor and second transistor according to certain aspects of the present disclosure.

FIG. 15 shows an example of a layout 1510 where the ratio is 4:8. In this example, first gates 515-1 to 515-4 are between second gates 520-1 to 520-4 and second gates

520-5 to 520-8. The source/drain 525-5 between first gate 515-1 and second gate 520-4 is shared by the first and second transistors A and B, and the source/drain 525-9 between first gate 515-4 and second gate 520-5 is shared by the first and second transistors A and B.

In this example, the number of the first gates 515-1 to 515-4 is even (i.e., four) and the number of the second gates 520-1 to 520-8 is even (i.e., eight). The source/drain 525-1 on the left side of the first active region 512 and the source/drain 525-13 on the right side of the active region 512 are coupled to the same node (i.e., node Y). Also, in this example, the number of the third gates 535-1 to 535-12 (i.e., twelve) is equal to the sum of the number of the first gates 515-1 to 515-4 and the number of the second gates 520-1 to 520-8.

Figure 16:
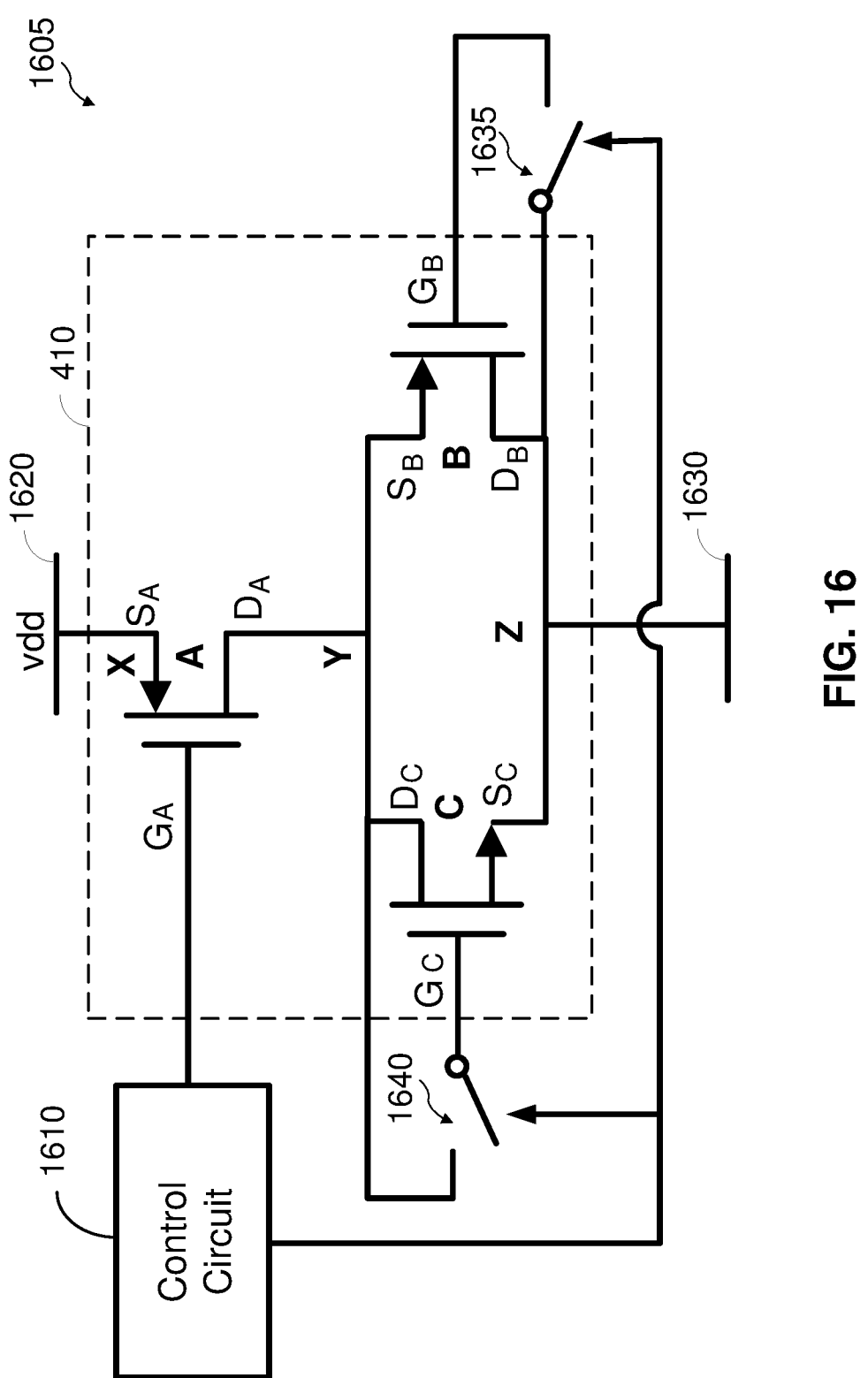
FIG. 16 shows an example in which the circuit in FIG. 4 is used for power switching according to certain aspects of the present disclosure.

In certain aspects, the exemplary circuit 410 may be used for power switching in a system 1605. In this regard, FIG. 16 shows an example in which node X is coupled to a first supply rail 1620 and node Z is coupled to a second supply rail 1630. The first supply rail 1620 provides a voltage supply vdd (e.g., from a power management integrated circuit (PMIC) or another voltage source). The second supply rail 1630 may be coupled to a circuit (e.g., processor, logic, memory, etc.) that receives power. For the exemplary layout 510 shown in FIG. 5, the first supply rail 1620 is coupled to the source/drain 525-3 in the first active region 512 that is between two adjacent first gates 515-1 and 515-2. As used herein, two gates are adjacent when there is no intervening gate(s) between them.

In this example, the system 1605 includes a control circuit 1610, a first switch 1635, and a second switch 640. The control circuit 1610 is coupled to the gate terminal $G_A$ of the first transistor A to control the on/off state of the first transistor A. The first switch 1635 is coupled between the gate terminal $G_B$ of the second transistor B and the drain terminal $D_B$ of the second transistor B. For the exemplary layout 510 shown in FIG. 5, a first terminal of the first switch 1635 is coupled to the second gates 520-1 and 520-2 and a second terminal of the first switch 1635 is coupled to sources/drains 525-1 and 525-5. The second switch 1640 is coupled between the gate terminal $G_C$ of the third transistor C and the drain terminal $D_C$ of the third transistor C. For the exemplary layout 510 shown in FIG. 5, a first terminal of the second switch 1640 is coupled to the third gates 535-1 to 535-5 and a second terminal of the second switch 1640 is coupled to the sources/drains 545-2 and 545-4. The second terminal of the second switch 1640 may also be coupled to the sources/drains 525-2 and 525-4 (which are shared by transistors A and B) through the metal routings 555-1 and 555-2. Each of the switches 1635 and 1640 may be implemented with a respective transistor. The control circuit 1610 controls the on/off states of the switches 1635 and 1640.

The control circuit 1610 is configured to decouple the second supply rail 1630 from the first supply rail 1620 by turning off the first transistor A and turning off the switches 1635 and 1640. For example, the control circuit 1610 may decouple the second supply rail 1630 from the first supply rail 1620 when the circuit (not shown) coupled to the second supply rail 1630 is powered off or when the circuit coupled to the second supply rail 1630 is supplied by another supply voltage (e.g., a supply voltage other than vdd) through another power switch (not shown).

To power up the circuit coupled to the second supply rail 1630 with supply voltage vdd, the control circuit 1610 is configured to turn on the first transistor A (e.g., by applying a low voltage to the gate terminal $G_A$ of the first transistor A) and turn on the switches 1635 and 1640. When the first switch 1635 is turned on, the first switch 1635 couples the gate terminal $G_B$ and the drain terminal $D_B$ of the second transistor B together causing the second transistor B to act as a diode-connected transistor. Similarly, when the second switch 1640 is turned on, the second switch 1640 couples the gate terminal $G_C$ and the drain terminal $D_C$ of the third transistor C together causing the third transistor C to act as a diode-connected transistor.

Thus, in this example, the first supply rail 1620 is coupled to the second supply rail 1630 through the first transistor A and diode-connected transistors B and C. The diode-connected transistors B and C help prevent unintentional current flow from the second supply rail 1630 to the first supply rail 1620. For example, the second supply rail 1630 may initially be at a higher potential than the first supply rail 1620. This may occur, for example, when the second supply rail 1630 is switching from another supply voltage that is higher than vdd to the supply voltage vdd. In this example, the diode-connected transistors C and B prevent the initially higher potential at the second supply rail 630 from causing current flow from the second supply rail 1630 to the first supply rail 1620.

It is to be appreciated that the system 1605 may include additional power switches between the first supply rail 1620 and the second supply rail 1630 in addition to the circuit 410 shown in FIG. 16. It is also to be appreciated that the circuit 410 is not limited to being used as a power switch, and may be used in other applications. Accordingly, the circuit 410 is not limited to the example shown in FIG. 16.

It is to be appreciated that the layout techniques according to aspects of the present disclosure may be used for FinFETs, planar transistors, gate all around (GAA) transistors, and other types of transistors.

Implementation examples are described in the following numbered clauses:

1. A chip, comprising:
   a first active region;
   first gates extending over the first active region in a first direction, wherein the first gates correspond to a first transistor; and
   second gates extending over the first active region in the first direction, wherein the second gates correspond to a second transistor.
2. The chip of clause 1, wherein:
   a number of the first gates is even; and
   a number of the second gates is even.
3. The chip of clause 2, wherein a ratio of the number of the first gates to the number of the second gates is 2:2, 2:6, 6:2, 4:4, or 4:8.
4. The chip of any one of clauses 1 to 3, further comprising:
   a first gate interconnect coupling the first gates to one another; and
   a second gate interconnect coupling the second gates to one another.
5. The chip of any one of clauses 1 to 4, wherein a first one of the first gates and a second one of the first gates are separated by one or more of the second gates.
6. The chip of clause 5, wherein a first one of the second gates and a second one of the second gates are separated by one or more of the first gates.
7. The chip of any one of clauses 1 to 4, wherein the first gates are interspersed across the first active region.
8. The chip of clause 7, wherein the second gates are interspersed across the second active region.

9. The chip of any one of clauses 1 to 8, wherein:
   the first active region includes fins extending in a second direction that is perpendicular to the first direction;
   the first gates are formed over the fins; and
   the second gates are formed over the fins.
10. The chip of any one of clauses 1 to 9, wherein the first transistor and the second transistor share at least one source/drain in the first active region.
11. The chip of any one of clauses 1 to 10, further comprising a switch having a first terminal and a second terminal, wherein the first terminal is coupled to the second gates and the second terminal is coupled to a first source/drain in the first active region.
12. The chip of clause 11, further comprising a supply rail coupled to a second source/drain in the first active region.
13. The chip of clause 12, wherein the second source/drain is between adjacent ones of the first gates.
14. The chip of any one of clauses 1 to 13, further comprising:
    a second active region; and
    third gates extending over the second active region in the first direction, wherein the third gates correspond to a third transistor.
15. The chip of clause 14, further comprising metal routings, wherein each of the metal routings couples a respective source/drain in the first active region to a respective source/drain in the second active region.
16. The chip of clause 14 or 15, wherein a number of the third gates is equal to a sum of a number of the first gates and a number of the second gates.
17. The chip of clause 16, wherein:
    a number of the first gates is even; and
    a number of the second gates is even.
18. The chip of any one of clauses 14 to 17, further comprising:
    a first gate interconnect coupling the first gates to one another;
    a second gate interconnect coupling the second gates to one another; and
    a third gate interconnect coupling the third gates to one another.
19. The chip of any one of clauses 14 to 18, wherein:
    the first transistor and the second transistor are of a same channel type; and
    the third transistor is of a different channel type than the first transistor and the second transistor.
20. The chip of clause 19, wherein:
    the first transistor includes a first p-type transistor;
    the second transistor includes a second p-type transistor; and
    the third transistor includes an n-type transistor.
21. The chip of any one of clauses 14 to 19, wherein the first transistor and the second transistor share at least one source/drain in the first active region, and the chip further comprises a switch having a first terminal and a second terminal, wherein the first terminal is coupled to the third gates and the second terminal is coupled to the at least one source/drain in the first active region.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
a first active region;
first gates extending over the first active region in a first direction, wherein the first gates correspond to a first transistor;
second gates extending over the first active region in the first direction, wherein the second gates correspond to a second transistor, a first one of the first gates and a second one of the first gates are between a first one of the second gates and a second one of the second gates, the first transistor and the second transistor share a first source/drain in the first active region between the first one of the first gates and the first one of the second gates, and the first transistor and the second transistor share a second source/drain in the first active region between the second one of the first gates and the second one of the second gates;
a first gate interconnect coupling the first gates to one another;
a second gate interconnect coupling the second gates to one another;
a second active region;
third gates extending over the second active region in the first direction, wherein the third gates correspond to a third transistor;
a first metal routing coupling the first source/drain in the first active region to a first source/drain in the second active region; and
a second metal routing coupling the second source/drain in the first active region to a second source/drain in the second active region.

2. The chip of claim 1, wherein:
a number of the first gates is even; and
a number of the second gates is even.

3. The chip of claim 2, wherein a ratio of the number of the first gates to the number of the second gates is 2:2.

4. The chip of claim 1, wherein the first gates are interspersed across the first active region.

5. The chip of claim 4, wherein the second gates are interspersed across the second active region.

6. The chip of claim 1, wherein:
the first active region includes fins extending in a second direction that is perpendicular to the first direction;
the first gates are formed over the fins; and
the second gates are formed over the fins.

7. The chip of claim 1, wherein a number of the third gates is equal to a sum of a number of the first gates and a number of the second gates.

8. The chip of claim 7, wherein:
a number of the first gates is even; and
a number of the second gates is even.

9. The chip of claim 1, further comprising
a third gate interconnect coupling the third gates to one another.

10. A chip, comprising:
a first active region;
first gates extending over the first active region in a first direction, wherein the first gates correspond to a first transistor;
second gates extending over the first active region in the first direction, wherein the second gates correspond to a second transistor, a first one of the first gates and a second one of the first gates are between a first one of the second gates and a second one of the second gates, the first transistor and the second transistor share a first source/drain in the first active region between the first one of the first gates and the first one of the second gates, and the first transistor and the second transistor share a second source/drain in the first active region between the second one of the first gates and the second one of the second gates;
a second active region;
third gates extending over the second active region in the first direction, wherein the third gates correspond to a third transistor;
a first metal routing coupling the first source/drain in the first active region to a first source/drain in the second active region;
a second metal routing coupling the second source/drain in the first active region to a second source/drain in the second active region; and
a switch having a first terminal and a second terminal, wherein the first terminal is coupled to the third gates and the second terminal is coupled to the first source/drain in the first active region.

11. The chip of claim 1, further comprising a first supply rail coupled to a third source/drain in the first active region.

12. The chip of claim 11, wherein the third source/drain is between the first one of the first gates and the second one of the first gates.

13. The chip of claim 12, further comprising:
a third metal routing coupling a fourth source/drain in the first active region to a third source/drain in the second active region, wherein the first one of the second gates is between the fourth source/drain in the first active region and the first source/drain in the first active region; and
a fourth metal routing coupling a fifth source/drain in the first active region to a fourth source/drain in the second active region, wherein the second one of the second gates is between the fifth source/drain in the first active region and the second source/drain in the first active region.

14. The chip of claim 13, further comprising
a second supply rail coupled to the fourth source/drain in the first active region and the fifth source/drain in the first active region.

15. The chip of claim 13, wherein a first one of the third gates is between the third source/drain in the second active region and the first source/drain in the second active region, and a second one of the third gates is between the second source/drain in the second active region and the fourth source/drain in the second active region.

16. The chip of claim 13, further comprising a switch having a first terminal and a second terminal, wherein the first terminal is coupled to the second gates and the second terminal is coupled to the fourth source/drain in the first active region and the fifth source/drain in the first active region.

17. The chip of claim 13, wherein the first source/drain in the first active region is configured to act as a drain for the first transistor and a source for the second transistor.

18. A chip, comprising:

a first active region;

first gates extending over the first active region in a first direction, wherein the first gates correspond to a first transistor;

second gates extending over the first active region in the first direction, wherein the second gates correspond to a second transistor, a first one of the first gates and a second one of the first gates are between a first one of the second gates and a second one of the second gates, the first transistor and the second transistor share a first source/drain in the first active region between the first one of the first gates and the first one of the second gates, and the first transistor and the second transistor share a second source/drain in the first active region between the second one of the first gates and the second one of the second gates;

a second active region;

third gates extending over the second active region in the first direction, wherein the third gates correspond to a third transistor, the first transistor and the second transistor are of a same channel type, and the third transistor is of a different channel type than the first transistor and the second transistor;

a first metal routing coupling the first source/drain in the first active region to a first source/drain in the second active region; and a second metal routing coupling the second source/drain in the first active region to a second source/drain in the second active region.

19. The chip of claim 18, wherein:

the first transistor includes a first p-type transistor;

the second transistor includes a second p-type transistor; and the third transistor includes an n-type transistor.

* * * * *